United States Patent
Yoshizumi et al.

(10) Patent No.: US 8,391,327 B2
(45) Date of Patent: Mar. 5, 2013

(54) GROUP III NITRIDE SEMICONDUCTOR ELEMENT AND EPITAXIAL WAFER

(75) Inventors: Yusuke Yoshizumi, Itami (JP); Yohei Enya, Itami (JP); Masaki Ueno, Itami (JP); Fumitake Nakanishi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/343,595

(22) Filed: Jan. 4, 2012

(65) Prior Publication Data

US 2012/0104433 A1 May 3, 2012

Related U.S. Application Data

(63) Continuation of application No. 12/965,633, filed on Dec. 10, 2010, now Pat. No. 8,107,507, which is a continuation of application No. 12/779,769, filed on May 13, 2010, now Pat. No. 7,873,088, which is a continuation of application No. PCT/JP2009/056978, filed on Apr. 3, 2009.

(30) Foreign Application Priority Data

Apr. 7, 2008 (JP) .................. 2008-099625

(51) Int. Cl.
*H01S 5/00* (2006.01)
(52) U.S. Cl. ................. 372/44.011; 372/43.01
(58) Field of Classification Search ........... 372/44.011, 372/43.01
See application file for complete search history.

(56) References Cited

U.S. PATENT DOCUMENTS

| 6,165,812 | A | 12/2000 | Ishibashi et al. |
| 6,653,663 | B2 | 11/2003 | Ishida |
| 7,873,088 | B2 * | 1/2011 | Yoshizumi et al. ...... 372/44.011 |
| 2001/0030328 | A1 | 10/2001 | Ishida |
| 2003/0132508 | A1 | 7/2003 | Ishida |
| 2003/0205783 | A1 | 11/2003 | Ishida |
| 2007/0164292 | A1 | 7/2007 | Okuyama |
| 2010/0052016 | A1 | 3/2010 | Hooper et al. |

FOREIGN PATENT DOCUMENTS

| JP | 09-180998 A | 7/1997 |
| JP | 10-135576 A2 | 5/1998 |
| JP | 11-220223 A | 8/1999 |

(Continued)

OTHER PUBLICATIONS

Funato et al., "Blue, Green, and Amber InGaN/GaN Light-Emitting Diodes on Semipolar {1122} GaN Bulk Substrates," Japanese Journal of Applied Physics, vol. 45, No. 26, pp. L659-L662, 2006.

(Continued)

*Primary Examiner* — Armando Rodriguez
(74) *Attorney, Agent, or Firm* — Venable LLP; Michael A. Sartori; Tamatane J. Aga

(57) ABSTRACT

A primary surface 23a of a supporting base 23 of a light-emitting diode 21a tilts by an off-angle of 10 degrees or more and less than 80 degrees from the c-plane. A semiconductor stack 25a includes an active layer having an emission peak in a wavelength range from 400 nm to 550 nm. The tilt angle "A" between the (0001) plane (the reference plane $S_{R3}$ shown in FIG. 5) of the GaN supporting base and the (0001) plane of a buffer layer 33a is 0.05 degree or more and 2 degrees or less. The tilt angle "B" between the (0001) plane of the GaN supporting base (the reference plane $S_{R4}$ shown in FIG. 5) and the (0001) plane of a well layer 37a is 0.05 degree or more and 2 degrees or less. The tilt angles "A" and "B" are formed in respective directions opposite to each other with reference to the c-plane of the GaN supporting base.

23 Claims, 16 Drawing Sheets

FOREIGN PATENT DOCUMENTS

| | | |
|---|---|---|
| JP | 11-354846 A | 12/1999 |
| JP | 2001-230497 | 8/2001 |
| JP | 2002-016000 A | 1/2002 |
| JP | 2002-344089 A | 11/2002 |
| JP | 2003-112999 A | 4/2003 |
| JP | 2005-277254 A | 10/2005 |
| JP | 2005-343713 A | 12/2005 |
| JP | 2007-189135 A | 7/2007 |

OTHER PUBLICATIONS

Sato et al., "High power and high efficiency green light emitting diode on free-standing semipolar (1122) bulk GaN substrate," Physical Status Solidi (RRL), vol. 1, No. 4, pp. 162-164, 2007.

Baker et al., "Characterization of Planar Semipolar Gallium Nitride Films on Sapphire Substrates," Japanese Journal of Applied Physics, vol. 45, No. 6, pp. L154-L157, 2006.

Young et al., "Lattice Tilt and Misfit Dislocations in (1122) Semipolar GaN Heteroepitaxy," Applied Physics Express, vol. 3, pp. 011004-1 to 011004-3, 2010.

Tyagi et al., "High Brightness Violet InGaN/GaN Light Emitting Diodes on Semipolar (1011) Bulk GaN Substrates," Japanese Journal of Applied Physics, vol. 46, No. 7, pp. L129-L131, 2007.

Kaeding et al., "Effect of Substrate Miscut on the Direct Growth of Semipolar (1011) GaN on (100) MgAl$_2$O$_4$ by Metalorganic Chemical Vapor Deposition," Japanese Journal of Applied Physics, vol. 45, No. 21, pp. L536-L538, 2006.

\* cited by examiner

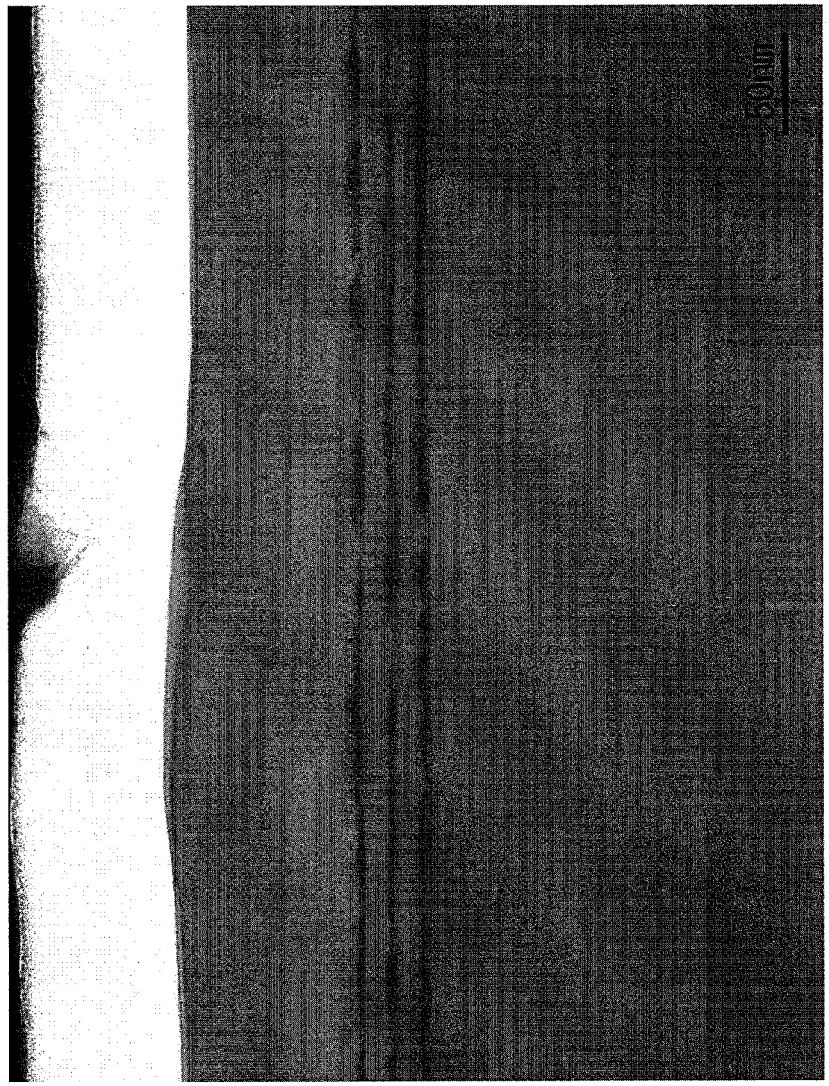
Fig.11
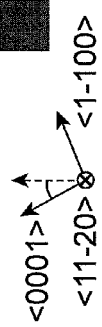

*Fig.14*
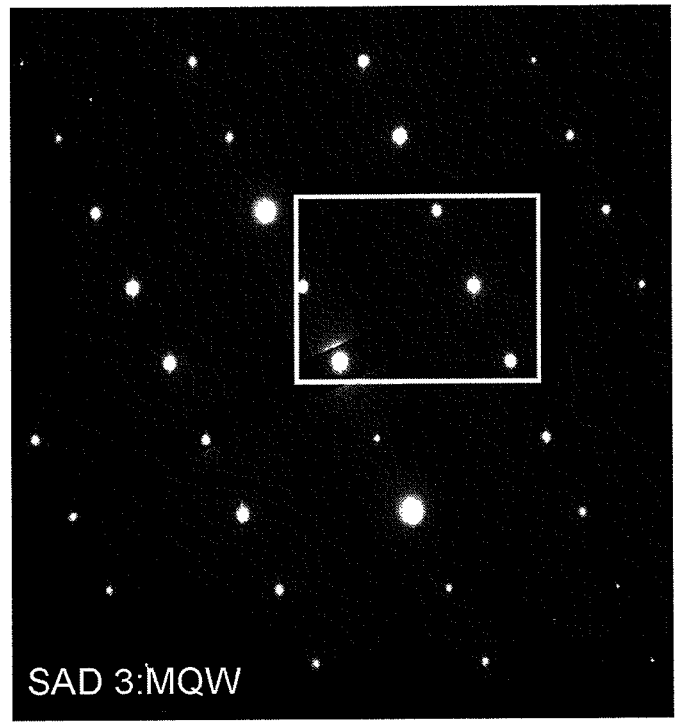
(a)
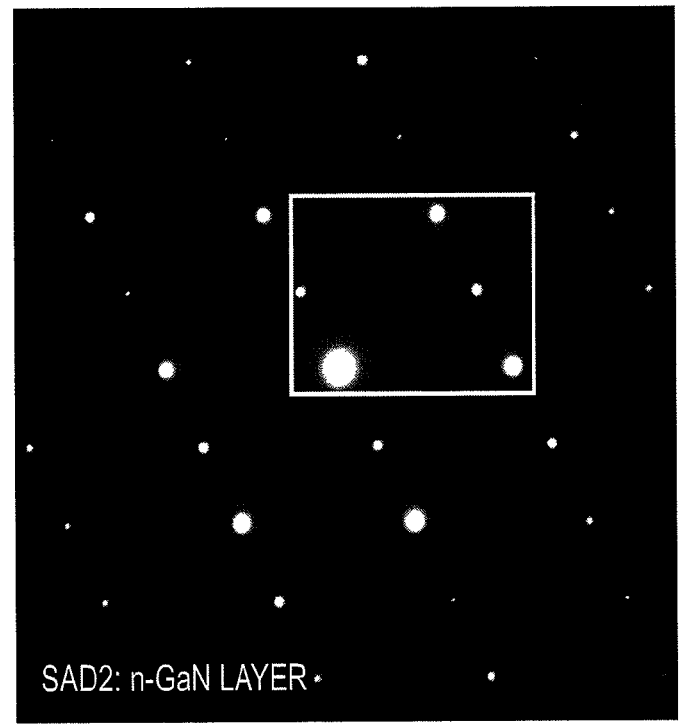
(b)

Fig.15
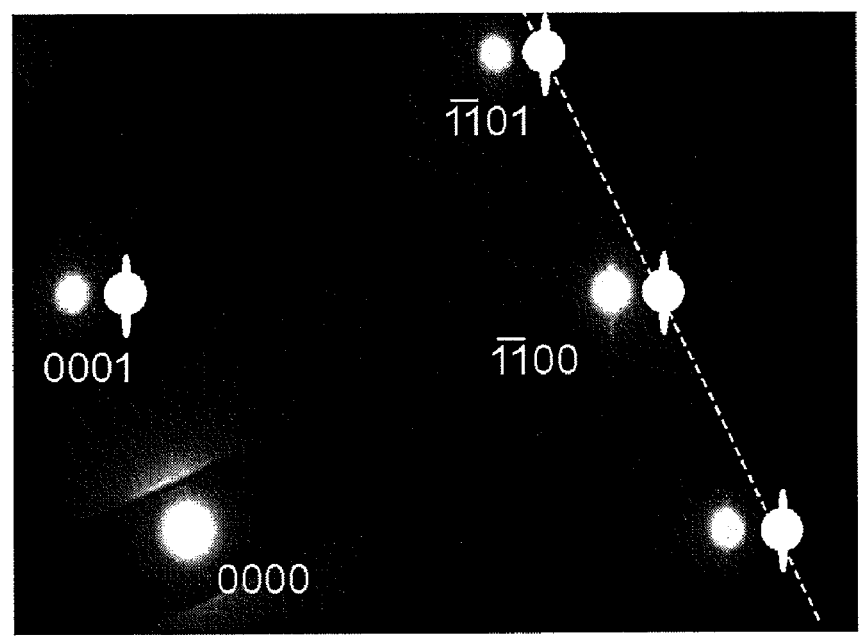
(a)
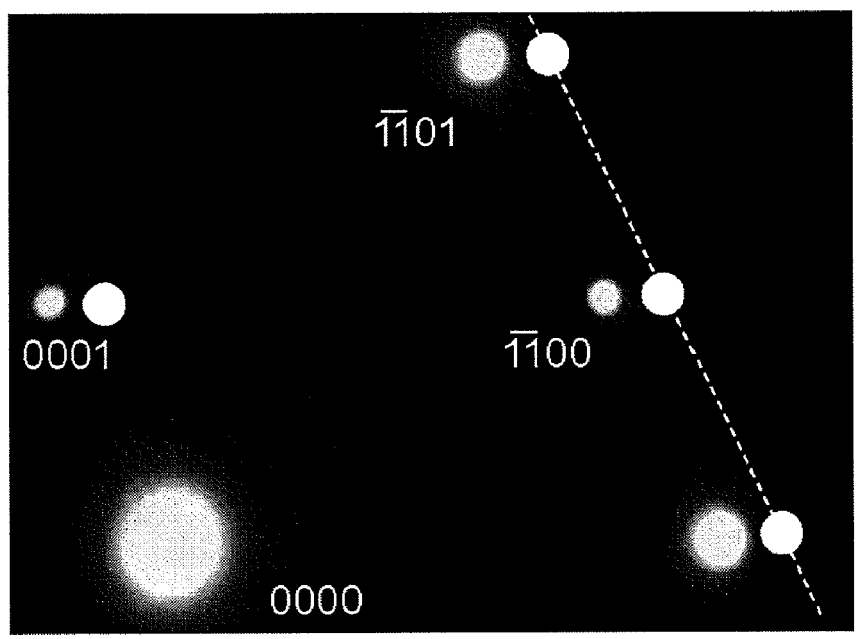
(b)

Fig.16
(a)
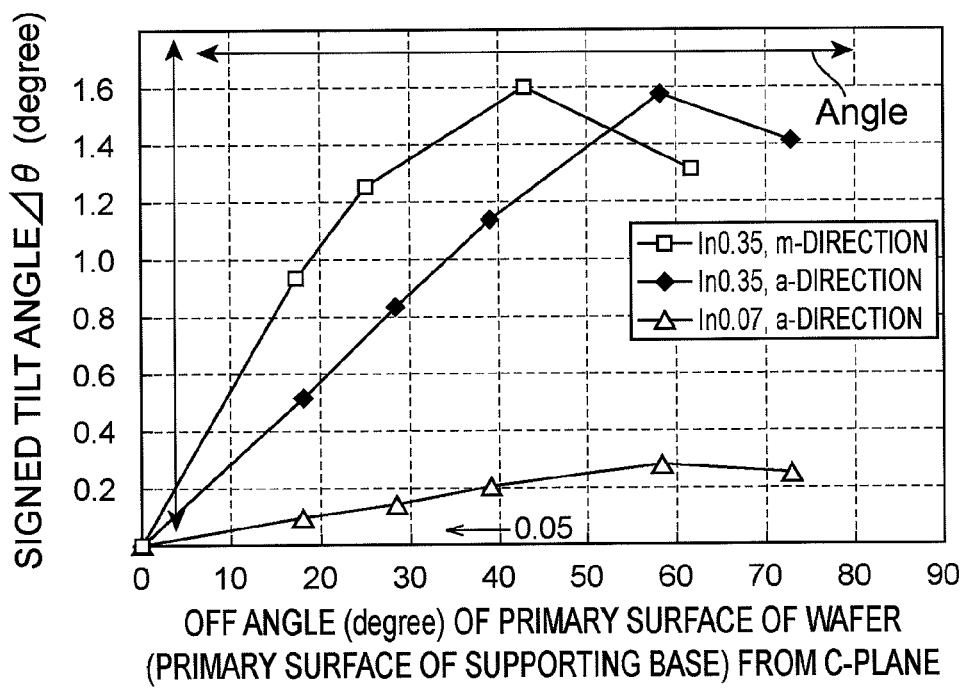
(b)
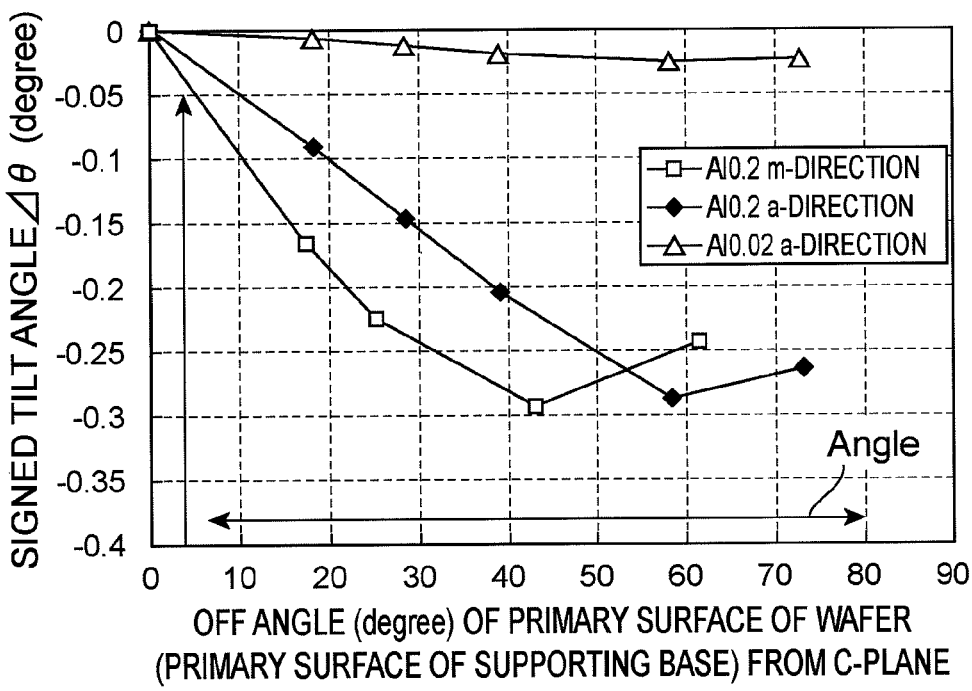

GROUP III NITRIDE SEMICONDUCTOR ELEMENT AND EPITAXIAL WAFER

CROSS REFERENCE TO RELATED APPLICATIONS

This is a continuation application of U.S. patent application Ser. No. 12/965,633 filed on Dec. 10, 2010, which is a continuation application of U.S. patent application Ser. No. 12/779,769 filed on May 13, 2010, which is a continuation application of a PCT application No. PCT/JP2009/056978 filed on Apr. 3, 2009, claiming the benefit of priorities from Japanese Patent application No. 2008-099625 filed on Apr. 7, 2008, and incorporated by reference in their entirety.

TECHNICAL FIELD

The present invention relates to a group III nitride semiconductor device and an epitaxial wafer.

BACKGROUND ART

Patent Literature 1 discloses a semiconductor light-emitting device. The semiconductor light-emitting device has a semiconductor stack, which lowers threshold current density for laser oscillation and reduces the occurrence of kink, and the semiconductor light-emitting device of a surface-emitting semiconductor laser has a fixed polarization plane of laser oscillation, and reduces a variation in the oscillation plane.

Patent Literature 2 discloses a light-emitting diode device, a semiconductor laser device, a photosensitive device and a transistor which are made of group III nitride semiconductors. These group III nitride semiconductor devices include an AlGaN layer having a high Al composition and a high carrier concentration. The growth of the AlGaN layer is carried out so as to enhance the surface diffusion of Al atoms, although the surface diffusion is small in AlGaN growth. The AlGaN layer with a high Al composition and a high carrier concentration can be grown on the surface of a GaN substrate that tilts by an angle of 1 degree to 20 degrees.

CITATION LIST

Patent Literature

Patent Literature 1: Japanese Unexamined Patent Application Publication No. 10-135576
Patent Literature 2: Japanese Unexamined Patent Application Publication No. 2002-16000

SUMMARY OF INVENTION

Technical Problem

In Patent Literature 1, an active layer is composed of a semiconductor having uniaxial anisotropy, and the thickness direction of the active layer is different from the direction of the axis of the uniaxial anisotropy. The semiconductor light-emitting device is formed on a substrate having a primary surface of (11-20) plane or (1-100) plane. The primary surface of the substrate can tilt from those planes by an off-angle of zero degrees or more, and the upper limit of the tilt angle is 10 degrees in order to prevent, for example, formation of a twin crystal. More specifically, the primary surface is an a-plane, an m-plane or a plane having a slight off-angle from the a-plane or the m-plane.

Although it is theoretically predicted that a semipolar plane provides a light-emitting device that exhibits excellent characteristics, a large-diameter wafer is not available. Results of growth experiments, which is limited to the range of the off-angle described in Patent Literature 2, are reported.

A crystal plane tilting from the c-plane at an angle larger than the off-angle described in Patent Literature 1 has so called semi-polarity, in contrast to the c-plane, the a-plane and the m-plane. In order to utilize the semi-polarity in a gallium nitride-based semiconductor, it is desired that the tilt angle from the c-plane is larger than the angle described in Patent Literature 1.

In a growth of a gallium nitride-based semiconductor layer on a substrate composed of a hexagonal compound, for example, a GaN substrate, strain is incorporated in the gallium nitride-based semiconductor layer due to a difference in crystal lattice constant between the hexagonal compound and the gallium nitride-based semiconductor layer. Relaxation of the strain in the gallium nitride-based semiconductor layer during the growth thereof forms dislocations. According to investigations conducted by the inventors, a gallium nitride-based semiconductor device utilizing semipolar may suppress the occurrence of the lattice relaxation and prevent the formation of dislocations in contrast to growth on a typical crystal plane, especially, the c-plane, the a-plane or the m-plane of a hexagonal compound.

It is an object of the present invention to provide a group III nitride semiconductor device that can suppress the formation of dislocations due to relaxation of strain incorporated in a gallium nitride-based semiconductor using semipolar, and it is another object of the present invention to provide an epitaxial wafer for the group III nitride semiconductor device.

Solution to Problem

According to an aspect of the present invention, a group III nitride semiconductor device comprises: (a) a supporting base having a primary surface, the primary surface comprising a hexagonal compound, the primary surface tilting by an off-angle of 10 degrees or more and less than 80 degrees with reference to a c-plane of the hexagonal compound; and (b) a semiconductor region provided on the primary surface of the supporting base, the semiconductor region comprising a semiconductor layer, the semiconductor layer comprising a hexagonal gallium nitride-based semiconductor different from the hexagonal compound. A tilt angle between a (0001) plane of the hexagonal compound of the supporting base and a (0001) plane of the hexagonal gallium nitride-based semiconductor of the semiconductor layer is in a range of +0.05 degree to +2 degrees and −0.05 degree to −2 degrees, and the hexagonal gallium nitride-based semiconductor of the semiconductor layer comprises one of AlGaN and InGaN.

In the supporting base of the group III nitride semiconductor device having the off-angle range described above, a tilt angle between the (0001) plane of the supporting base and the (0001) plane of the hexagonal gallium nitride-based semiconductor of 0.05 degree or more and 2 degrees or less suppresses relaxation of strain in the hexagonal gallium nitride-based semiconductor to prevent an increase in dislocation density in the hexagonal gallium nitride-based semiconductor.

In the group III nitride semiconductor device of the present invention, the <0001> direction of the supporting base is different from the <0001> direction of hexagonal gallium nitride-based semiconductor in a transmission electron microscopic image. In the group III nitride semiconductor device, since the hexagonal gallium nitride-based semiconductor is elastically deformed in the plane that is parallel to the primary surface of the supporting base, the occurrence of the relaxation of strain is suppressed, and the <0001> direction of GaN is different from the <0001> direction of the hexagonal gallium nitride-based semiconductor.

The group III nitride semiconductor device of the present invention comprises: (a) a supporting base having a primary surface, the primary surface comprising a hexagonal compound, the primary surface tilting by an off-angle of 10 degrees or more and less than 80 degrees with reference to a c-plane of a hexagonal compound; and (b) a semiconductor region provided on the primary surface of the supporting base, the semiconductor region comprising a semiconductor layer, and the semiconductor layer comprising a hexagonal gallium nitride-based semiconductor different from the hexagonal compound. A <0001> direction of the hexagonal compound is indicated by a first axis in a transmission electron microscopic image, and a <0001> direction of the hexagonal gallium nitride-based semiconductor is indicated by a second axis in the transmission electron microscopic image. The first axis extends in a direction different from a direction of the second axis in the transmission electron microscopic image.

In the supporting base of the group III nitride semiconductor device having the off-angle range described above, when the first axis that indicates the <0001> direction of the supporting base extends in a direction different from the direction of the second axis that indicates the <0001> direction of the hexagonal gallium nitride-based semiconductor, this difference suppresses the relaxation of strain in the hexagonal gallium nitride-based semiconductor and thus permits an increase in the dislocation density of the hexagonal gallium nitride-based semiconductor.

The group III nitride semiconductor device of the present invention, a semiconductor stack may include an active layer composed of a hexagonal gallium nitride-based semiconductor, and the active layer may be provided so as to emit light having an emission peak in the wavelength range of 400 to 550 nm. The active layer may include an InGaN well layer, and the group III nitride semiconductor device may be a light-emitting diode or a semiconductor laser. The group III nitride semiconductor device has satisfactory emission performance due to suppression of an increase in the dislocation density.

The supporting base of the group III nitride semiconductor device according to the present invention may be composed of sapphire, SiC or GaN. In the group III nitride semiconductor device, the supporting base composed of such a material can use the effect of the suppression of the relaxation of strain.

The supporting base of the group III nitride semiconductor device of the present invention may be composed of the gallium nitride-based semiconductor. The supporting base has a semipolar primary surface. Since the supporting base and the semiconductor layer of the group III nitride semiconductor device are composed of gallium nitride-based semiconductor, the gallium nitride-based semiconductor with high crystal quality can be grown on the supporting base of the gallium nitride-based semiconductor.

The supporting base of the group III nitride semiconductor device according to the present invention may have a gallium nitride-based semiconductor region with a threading dislocation density of $1\times10^7$ cm$^{-2}$ or less. In the group III nitride semiconductor device, the gallium nitride-based semiconductor can be grown on the gallium nitride-based semiconductor region with low dislocations. Thus, the occurrence of the relaxation of strain is made reduced because the dislocations coming from the substrate are low.

In the group III nitride semiconductor device according to the present invention, the hexagonal compound of the supporting base is GaN, and the tilt angle is defined by an angle between the (0001) plane of the GaN of the supporting base and the (0001) plane of the hexagonal gallium nitride-based semiconductor of the semiconductor layer.

In the group III nitride semiconductor device, using a high-quality GaN wafer can reduce the occurrence of the strain relaxation caused by dislocations from the substrate.

In the group III nitride semiconductor device according to the present invention, the hexagonal gallium nitride-based semiconductor of the semiconductor layer may be composed of InGaN. The tilt angle is defined by an angle between the (0001) plane of GaN of the supporting base and the (0001) plane of InGaN of the semiconductor layer. The group III nitride semiconductor device can reduce the occurrence of relaxation of strain in the InGaN layer. Alternatively, in the group III nitride semiconductor device according to the present invention, the hexagonal gallium nitride-based semiconductor of the semiconductor layer may be composed of AlGaN. The tilt angle is defined by an angle between the (0001) plane of GaN of the supporting base and the (0001) plane of AlGaN of the semiconductor layer. The group III nitride semiconductor device can reduce the occurrence of relaxation of strain in the AlGaN layer.

The hexagonal gallium nitride-based semiconductor of the group III nitride semiconductor device according to the present invention is elastically deformed in the plane that is parallel to the primary surface of the supporting base. In the group III nitride semiconductor device, the relaxation of strain is reduced because the hexagonal gallium nitride-based semiconductor is elastically deformed in the plane that is parallel to the primary surface of the supporting base.

The supporting base of the group III nitride semiconductor device according to the present invention may include, for example, a sapphire substrate or an SiC substrate. For example, the supporting base may include an A-plane sapphire substrate and a GaN layer grown on the sapphire substrate.

An epitaxial wafer according to another aspect of the present invention comprises: (a) a wafer having a primary surface, the primary surface comprising a hexagonal compound, the primary surface tilting by an off-angle of 10 degrees or more and less than 80 degrees with reference to a c-plane of the hexagonal compound; and (b) a semiconductor region provided on the primary surface of the wafer, the semiconductor region comprising a semiconductor layer, the semiconductor layer comprising a hexagonal gallium nitride-based semiconductor different from the hexagonal compound. A tilt angle between a (0001) plane of the hexagonal compound of the wafer and a (0001) plane of the hexagonal gallium nitride-based semiconductor of the semiconductor layer is in a range of +0.05 degree to +2 degrees and −0.05 degree to −2 degrees, and the hexagonal gallium nitride-based semiconductor of the semiconductor layer comprises one of AlGaN and InGaN.

In the wafer of the epitaxial wafer having the off-angle range described above, a tilt angle (absolute value) between the (0001) plane of the supporting base and the (0001) plane of the hexagonal gallium nitride-based semiconductor of 0.05 degree or more and 2 degrees or less can suppress the relaxation of strain in the hexagonal gallium nitride-based semiconductor and thus prevents an increase in the dislocation density of the hexagonal gallium nitride-based semiconductor.

In the epitaxial wafer of the present invention, the <0001> direction of the hexagonal compound of the wafer is different from the <0001> direction of hexagonal gallium nitride-based semiconductor in a transmission electron microscopic image. In the epitaxial wafer, since the hexagonal gallium nitride-based semiconductor is elastically deformed in the plane that is parallel to the primary surface of the wafer, the occurrence of the strain relaxation is suppressed, so that the <0001> direction of the hexagonal compound is different from the <0001> direction of the hexagonal gallium nitride-based semiconductor.

The epitaxial wafer of the present invention comprises: (a) a wafer having a primary surface, the primary surface comprising a hexagonal compound, the primary surface tilting by an off-angle of 10 degrees or more and less than 80 degrees with reference to a c-plane of a hexagonal compound; and (b) a semiconductor region provided on the primary surface of the wafer, the semiconductor layer comprising a hexagonal gallium nitride-based semiconductor different from the hexagonal compound, and the semiconductor region comprising a semiconductor layer. A <0001> direction of the hexagonal compound is indicated by a first axis in a transmission electron microscopic image, and a <0001> direction of the hexagonal gallium nitride-based semiconductor is indicated by a second axis in the transmission electron microscopic image. The first axis extends in a direction different from a direction of a second axis in the transmission electron microscopic image.

In the wafer of the epitaxial wafer having the off-angle in the above-described range, since the <0001> direction of the hexagonal compound is different from the direction of the <0001> direction of the hexagonal gallium nitride-based semiconductor, this difference can suppress the strain relaxation in the hexagonal gallium nitride-based semiconductor and thus prevents an increase in the dislocation density of the hexagonal gallium nitride-based semiconductor.

In the epitaxial wafer of the present invention, the semiconductor region may include an active layer composed of the hexagonal gallium nitride-based semiconductor, and the peak wavelength of a photoluminescence spectrum of the active layer may be in between 400 nm and 550 nm. In the present invention, suppression of an increase in dislocation density provides an epitaxial wafer for the group III nitride semiconductor device with excellent emission performance.

In the epitaxial wafer of the present invention, the wafer may be composed of sapphire, SiC or GaN. In the epitaxial wafer, the wafer composed of such a material can use the effect of the suppression of the strain relaxation.

In the epitaxial wafer according to the present invention, the wafer may be composed of a gallium nitride-based semiconductor, and the wafer has a semipolar primary surface. Since the supporting base and the semiconductor layer of the epitaxial wafer are composed of a gallium nitride-based semiconductor, the gallium nitride-based semiconductor with high crystal quality can be grown on the supporting base of the gallium nitride-based semiconductor.

The epitaxial wafer according to the present invention may have a gallium nitride-based semiconductor region with a threading dislocation density of $1 \times 10^7$ cm$^{-2}$ or less. In the epitaxial wafer, the gallium nitride-based semiconductor can be grown on the gallium nitride-based semiconductor region with low dislocations. Thus, lowering dislocations coming from the wafer reduces the occurrence of the strain relaxation.

In the epitaxial wafer of the present invention, the hexagonal compound of the wafer can be GaN, and the tilt angle is defined by an angle between the (0001) plane of the GaN of the wafer and the (0001) plane of the hexagonal gallium nitride-based semiconductor of the semiconductor layer.

Using a high-quality GaN wafer for forming the epitaxial wafer reduces the occurrence of the strain relaxation caused by dislocations coming from the wafer.

In the epitaxial wafer according to the present invention, the hexagonal gallium nitride-based semiconductor of the semiconductor layer may be composed of InGaN. The tilt angle may be defined by an angle between the (0001) plane of GaN of the wafer and the (0001) plane of InGaN of the semiconductor layer. This epitaxial wafer can reduce the occurrence of the strain relaxation in the InGaN layer. Alternatively, in the epitaxial wafer according to the present invention, the hexagonal gallium nitride-based semiconductor of the semiconductor layer may be composed of AlGaN, and the tilt angle is defined by an angle between the (0001) plane of GaN of the wafer and the (0001) plane of AlGaN of the semiconductor layer. This epitaxial wafer can reduce the occurrence of the strain relaxation in the AlGaN layer.

The hexagonal gallium nitride-based semiconductor of the epitaxial wafer of the present invention is elastically deformed in the plane that is parallel to the primary surface of the wafer. This epitaxial wafer can reduce the strain relaxation because of the elastic deformation of the hexagonal gallium nitride-based semiconductor caused in the plane parallel to the primary surface of the supporting base.

The foregoing and other objects, features, and advantages of the present invention will become more readily apparent from the following detailed description of a preferred embodiment of the invention, which proceeds with reference to the accompanying drawings.

Advantageous Effects of Invention

As described above, one aspect of the present invention provides a group III nitride semiconductor device that can suppress the formation of dislocations due to relaxation of strain incorporated in a gallium nitride-based semiconductor using semi-polarity. Another aspect of the present invention provides an epitaxial wafer for the group III nitride semiconductor device.

BRIEF DESCRIPTION OF DRAWINGS

FIG. 11 is a magnified view showing an image of an active layer and its vicinity in the LED structure shown in FIG. 5.

FIG. 14 is a view including electron diffraction patterns of an epitaxial wafer.

FIG. 15 is a view including magnified images of the electron diffraction patterns of the epitaxial wafer.

FIG. 16 is a view including graphs that show calculated values of tilt angles for InGaN and AlGaN, respectively.

DESCRIPTION OF EMBODIMENTS

Figure 1:
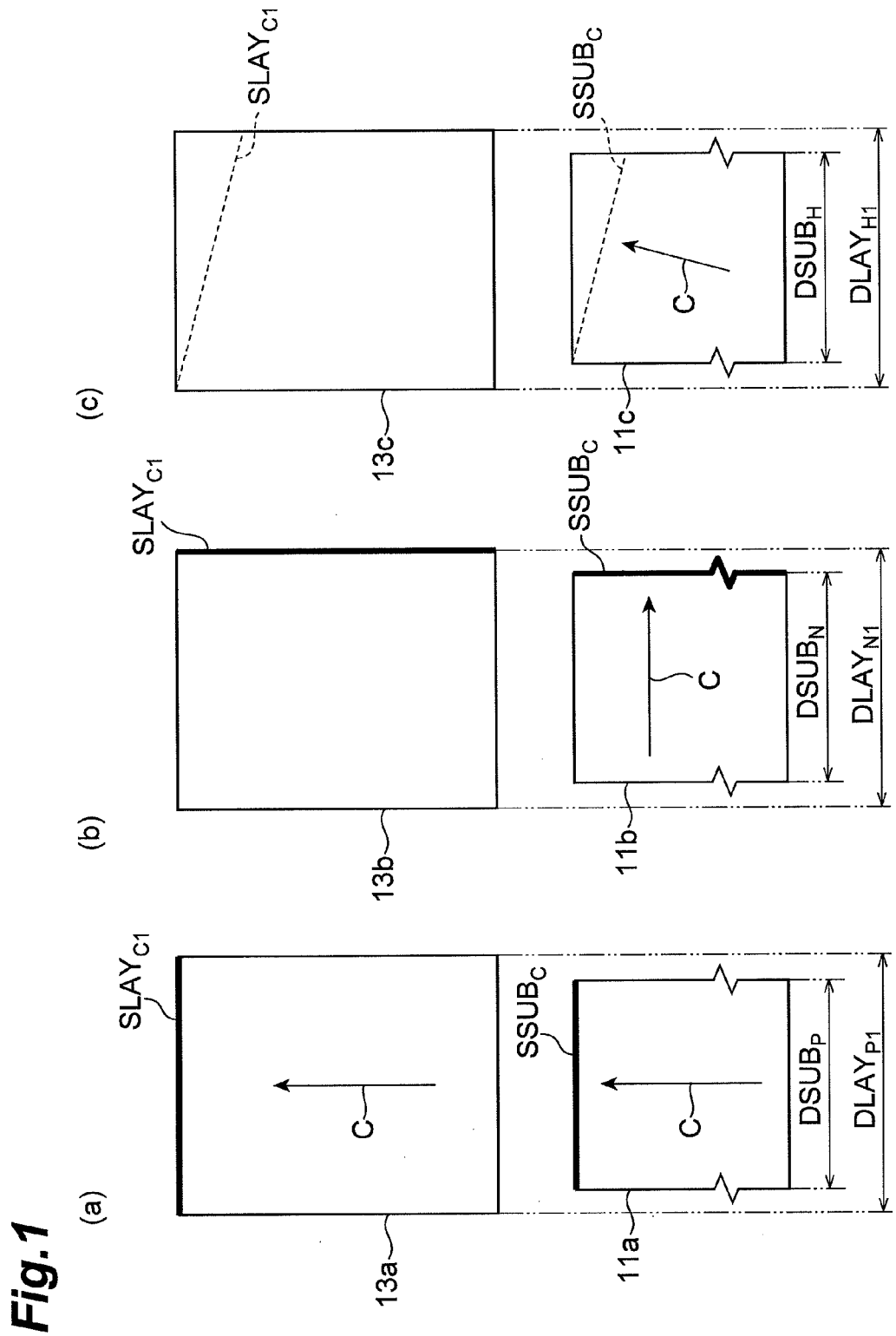
FIG. 1 is a view including schematic diagrams that show the relationship between the lattice constant of a hexagonal compound and the lattice constant of a hexagonal gallium nitride-based semiconductor.

The teaching of the present invention can readily be understood from the following detailed description with reference to the accompanying drawings by way of examples. Embodiments according to a group III nitride semiconductor device and an epitaxial wafer of the present invention will be described with reference to the accompanying drawings. The same components are designated by the same reference numerals, wherever possible.

A number of investigations have been made on crystal growth on the a-plane, the m-plane, and a crystal plane having a slight off-angle from the a-plane or the m-plane. However, what is desired is to provide the teaching of relaxation of strain incorporated in a hexagonal gallium nitride-based semiconductor for a semiconductor device that uses a semipolar gallium nitride-based semiconductor. The hexagonal gallium nitride-based semiconductor is grown on the primary surface of a substrate composed of a hexagonal compound, and the primary surface of the substrate tilts by an off-angle of 10 degrees or more to less than 80 degrees with reference to the c-plane of the hexagonal compound.

The group III nitride semiconductor device according to the embodiment includes a supporting base having such an off-angle, and a semiconductor region provided on the primary surface of the supporting base. The semiconductor region may be composed of a semiconductor stack including a semiconductor layer composed of a hexagonal gallium nitride-based semiconductor. An epitaxial wafer for the group III nitride semiconductor device according to the embodiment also includes a wafer having the off-angle, and a semiconductor region provided on the primary surface of the wafer. The semiconductor region includes a semiconductor film composed of a hexagonal gallium nitride-based semiconductor.

If a hexagonal compound is different from hexagonal gallium nitride-based semiconductor of the semiconductor layer, the lattice constant (for example, the lattice constant in the c-axis) of the hexagonal compound also is different from the lattice constant (for example, the lattice constant in the c-axis) of the hexagonal gallium nitride-based semiconductor. In this instance, the hexagonal gallium nitride-based semiconductor incorporates strain caused by the difference in the lattice constant. Strains are relaxed in crystal to form structural defects (for example, dislocations). However, an increase in the dislocations degrades the crystal quality of hexagonal gallium nitride-based semiconductor. Thus, a reduction in the dislocations is desired.

FIG. 1 is a view including schematic diagrams that show the relationships between the lattice constant of hexagonal compounds and the lattice constants of hexagonal gallium nitride-based semiconductors. In the materials shown in Parts (a) to (c) of FIG. 1, the lattice constants of the hexagonal compounds are smaller than those of the hexagonal gallium nitride-based semiconductors. The vectors C shown in the schematic diagrams of FIG. 1 indicate the respective directions of the c-axis in the hexagonal compounds. The reference symbol $SSUB_C$ indicates the c-plane of the hexagonal compound. The reference symbol $SLAY_{C1}$ indicates the c-plane of the hexagonal gallium nitride-based semiconductor. The reference symbols 11a, 11b and 11c indicate wafers composed of the hexagonal compound, while the reference characters 13a, 13b and 13c indicate semiconductor layers composed of the hexagonal gallium nitride-based semiconductor. The maximum of the distance between two points on the edges of the wafers 11a, 11b, and 11c may be 45 mm or more. The area of the primary surface of the wafers 11a, 11b, and 11c can be, for example, 15 cm$^2$ or more.

With reference to Part (a) of FIG. 1, the wafer 11a is provided, and has a primary surface of polar c-plane. The hexagonal gallium nitride-based semiconductor 13a is to be grown on the wafer 11a. The original lattice constant $DLAY_{P1}$ inherent to the hexagonal gallium nitride-based semiconductor 13a is larger than the original lattice constant $DSUB_P$ inherent to the hexagonal compound of the wafer 11a. This lattice constant is defined in the direction of the a-axis or the m-axis.

With reference to Part (b) of FIG. 1, the wafer 11b is prepared which has a primary surface of a nonpolar a-plane (or m-plane). The hexagonal gallium nitride-based semiconductor 13b is to be grown on the wafer 11b. The lattice constant $DLAY_{N1}$ of the hexagonal gallium nitride-based semiconductor 13b is larger than the lattice constant $DSUB_N$ of the hexagonal compound of the wafer 11b. This lattice constant is defined in the direction of the c-axis.

With reference to Part (c) of FIG. 1, the wafer 11c is prepared which has a semipolar primary surface. The primary surface of the wafer 11c is composed of the hexagonal compound, and the primary surface tilts by an off-angle of 10 degrees or more and less than 80 degrees with reference to the c-plane of the hexagonal compound. The hexagonal gallium nitride-based semiconductor 13c is to be grown on the wafer 11c. In the wafer 11c having the tilting primary surface, the lattice constants as shown in Parts (a) and (b) of FIG. 1 are represented in association with the primitive lattice in terms of the axial direction of the primitive lattice. However, the relationship between the size of the primitive lattice $DLAY_{H1}$ of the hexagonal gallium nitride-based semiconductor 13c and the size of the primitive lattice $DSUB_H$ of the hexagonal compound of the wafer 11c is the same as those shown in Parts (a) and (b) of FIG. 1, and thus the relationship $DLAY_{H1} > DSUB_H$ is satisfied.

Figure 2:
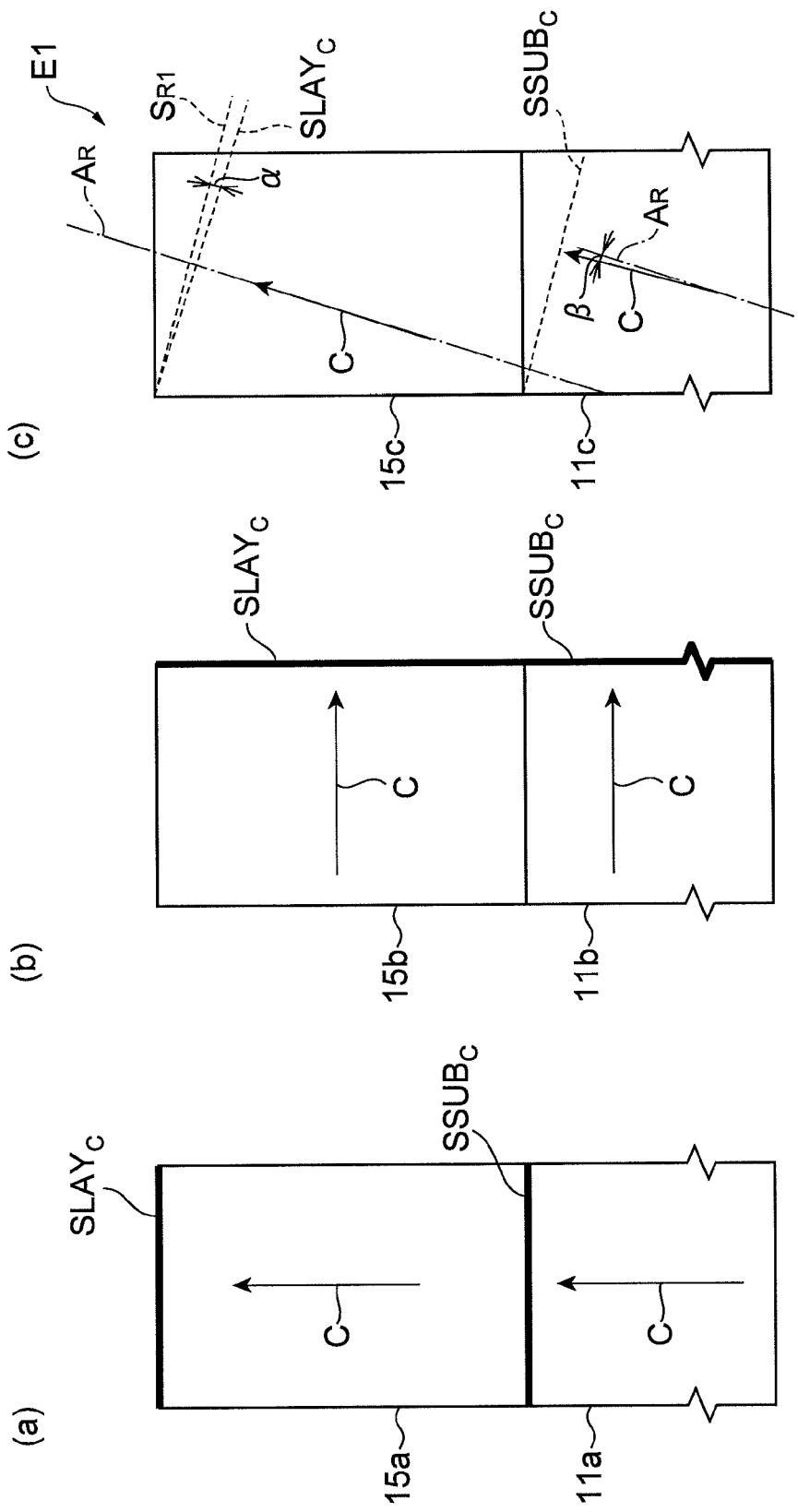
FIG. 2 is a view including schematic diagrams each of which illustrates a semiconductor layer of a hexagonal gallium nitride-based semiconductor grown on a supporting base of a hexagonal compound.

FIG. 2 is a view including schematic diagrams, each of which illustrates a semiconductor layer of a hexagonal gallium nitride-based semiconductor grown on a supporting base of a hexagonal compound. In the materials shown in FIG. 1, the lattice constant of the hexagonal compound is smaller than that of the hexagonal gallium nitride-based semiconductor. The vectors C shown in Parts (a), (b) and (c) of FIG. 2 indicate the direction of the c-axis in the hexagonal compound and the hexagonal gallium nitride-based semiconductor. If the hexagonal gallium nitride-based semiconductors are grown on the wafers 11a, 11b and 11c, the original lattice constants inherent to the hexagonal gallium nitride-based semiconductors 13a, 13b and 13c vary depending on the lattice constants of the wafer 11a, 11b and 11c, to form hexagonal gallium nitride-based semiconductors 15a, 15b, and 15c, respectively. Consequently, the hexagonal gallium nitride-based semiconductors 15a, 15b, and 15c involve strains. If lattice defects, for example, dislocations are induced during the crystal growth, they release strains to degrade the crystal quality. Thus, the occurrence of the strain relaxation is not desirable.

With reference to Part (c) of FIG. 2, the semipolar hexagonal gallium nitride-based semiconductor 15c also incorporates strain. In contrast to the hexagonal gallium nitride-based semiconductors 15a and 15b grown on the c-plane, the a-plane and the m-plane, in the hexagonal gallium nitride-based semiconductor 15c in which the strain remains without relaxation, the crystal plane such as the c-plane $SSUB_C$ of the wafer 11c extends parallel to the reference plane $S_{R1}$ that is not parallel to the corresponding crystal plane, for example, the c-plane $SLAY_{C1}$ of the hexagonal gallium nitride-based semiconductor 15c. The angular difference between the above two c-planes is estimated from results of the X-ray diffractometry, as described below.

Where dislocations are formed during the growth of the hexagonal gallium nitride-based semiconductor onto the wafer 11c to relax strains therein, the number of dislocations that are created in the hexagonal gallium nitride-based semiconductor grown on the wafer 11c is very large. In such a case, the strain relaxation results in the deformation of the hexagonal gallium nitride-based semiconductor in which the crystal plane, for example, the c-plane $SLAY_{C1}$ of the hexagonal gallium nitride-based semiconductor extends parallel to a predefined crystal plane, for example, the c-plane $SSUB_C$ of the wafer 11b. For example, when the hexagonal compound is GaN, the hexagonal gallium nitride-based semiconductor is composed of, for example, InGaN or InAlGaN. The lattice constant of InGaN depends on its indium composition and is larger than that of GaN.

Where the hexagonal gallium nitride-based semiconductor 15c also incorporates strain, the occurrence of the relaxation in its growth becomes very low. In such a case, the result of the X-ray diffractometry demonstrates that the tilt angle $\alpha$ (absolute value) between the c-plane $SLAY_{C1}$ and the reference plane $S_{R1}$ in the hexagonal gallium nitride-based semiconductor 15c is 0.05 degree or more. In addition, the tilt angle $\alpha$ (absolute value) is 2 degree or less. For example, when the hexagonal gallium nitride-based semiconductor is composed of InGaN and the wafer 11c is composed of GaN, the tilt angle is defined by an angle between the (0001) plane of GaN of the wafer 11c and the (0001) plane of InGaN of the semiconductor layer, for example. The occurrence of strain relaxation in the InGaN layer is reduced, and the number of dislocations formed during the growth of the hexagonal gallium nitride-based semiconductor 15c is very small. The above relationship on the tilt angle holds over the entire primary surface of the wafer 11c. In order to satisfy the relationship of the tilt angle, the indium composition is preferably 0.07 or more and 0.35 or less.

Although the above explanation is made, as an example, on a single semiconductor layer composed of the hexagonal gallium nitride-based semiconductor grown on the wafer 11c with reference to FIGS. 1 and 2, the incorporation of strain is also applicable to a structure that includes a semiconductor stack including a plurality of semiconductor layers grown on the wafer 11c.

As can be seen from the above description, in the wafer 11c having the off-angle range described above, when a tilt angle (absolute value) between the (0001) plane of the wafer 11c and the (0001) plane of the hexagonal gallium nitride-based semiconductor 15c is in the range of 0.05 degree or more and 2 degrees or less, the strain relaxation is suppressed in the hexagonal gallium nitride-based semiconductor 15c to avoid an increase in the dislocation density of the hexagonal gallium nitride-based semiconductor 15c in the group III nitride semiconductor device.

With reference to Part (c) of FIG. 2, the axis $A_R$ indicates the <0001> direction of the hexagonal gallium nitride-based semiconductor 15c. In a transmission electron beam diffraction image, the <0001> direction of the wafer 11c is different from the axis $A_R$. In order to clearly show the angular difference, an auxiliary axis $A_R$ is also depicted in conjunction with the c-axis vector C of the wafer 11c. The angle $\beta$ between the auxiliary axis $A_R$ and the vector C is related to strain incorporated therein, and the angle $\beta$ is substantially equal to the angle $\alpha$. When these angles (absolute values) are 0.05 degree or more and 2 degrees or less, the relaxation of strain is suppressed in the hexagonal gallium nitride-based semiconductor 15c, and thus an increase in the density of dislocations in the hexagonal gallium nitride-based semiconductor 15c in the group III nitride semiconductor device is avoided. The hexagonal gallium nitride-based semiconductor 15c is elastically deformed in the plane parallel to the primary surface of the wafer 11c to suppress the occurrence of strain relaxation, so that the <0001> direction of the wafer 11c is different from the <0001> direction of the hexagonal gallium nitride-based semiconductor 15c. The above relationships of the tilt angle is satisfied over the entire primary surface of the wafer 11c.

Figure 3:
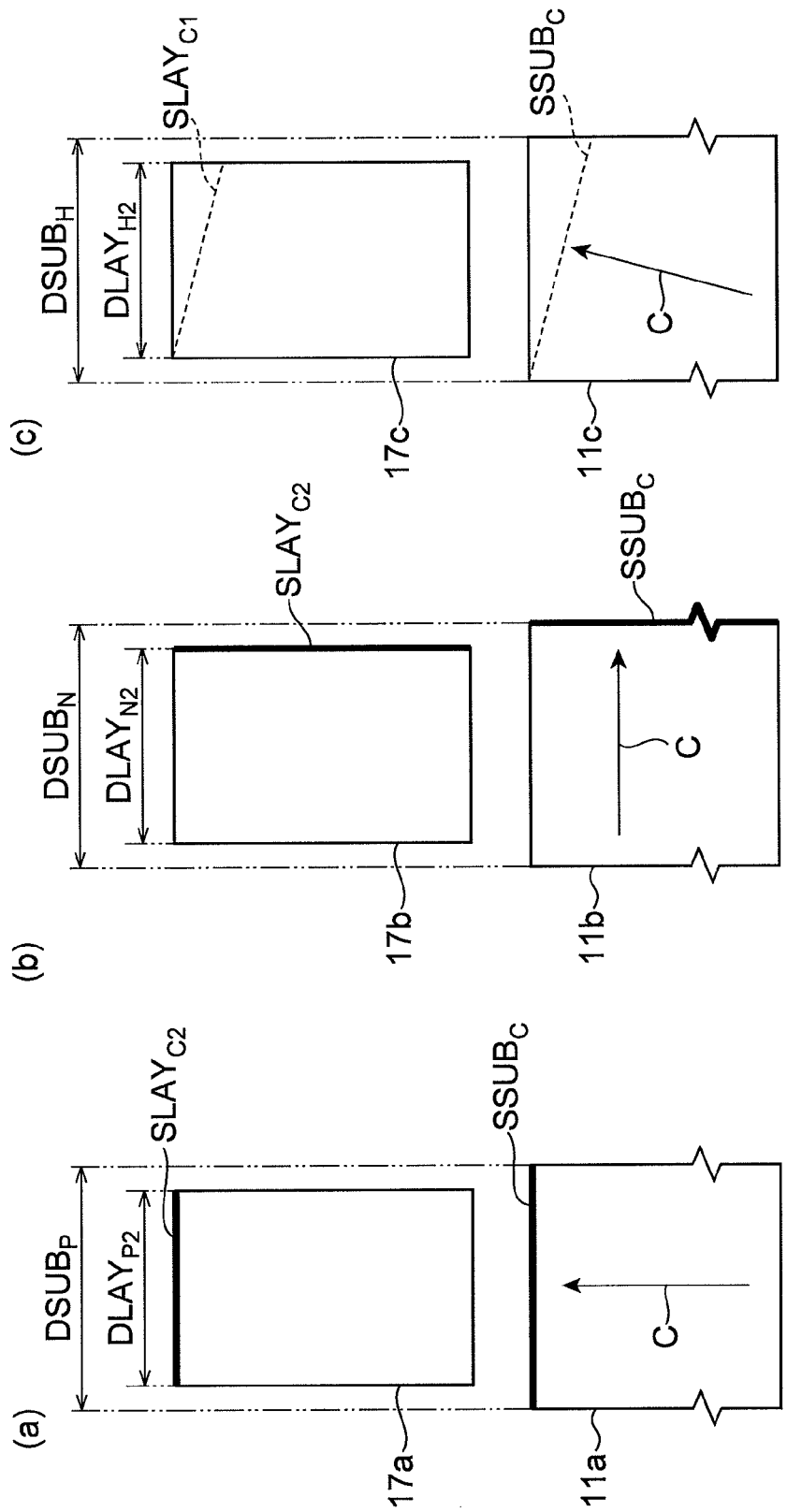
FIG. 3 is a view including schematic diagrams each of which shows the relationship between the lattice constant of a hexagonal compound and the lattice constant of a hexagonal gallium nitride-based semiconductor.

FIG. 3 includes other schematic views showing the relationship between the lattice constant of a hexagonal compound and the lattice constant of a hexagonal gallium nitride-based semiconductor. In the materials shown in FIG. 3, the lattice constant of the hexagonal compound is larger than that of the hexagonal gallium nitride-based semiconductor. The vectors C shown in Parts (a), (b) and (c) in FIG. 3 indicate the direction of the c-axis of the hexagonal compound, and the reference symbols $SSUB_P$ and $SLAY_P$ represent the c-planes of the hexagonal compound and the hexagonal gallium nitride-based semiconductor, respectively. The reference symbols 11a, 11b and 11c indicate supporting bases composed of the hexagonal compound, and the reference symbols 17a, 17b and 17c indicate semiconductor layers composed of the hexagonal gallium nitride-based semiconductor.

With reference to Part (a) of FIG. 3, the wafer 11a is prepared which has a primary surface of polar c-plane. The hexagonal gallium nitride-based semiconductor 17a is to be grown on the wafer 11a. The original lattice constant $DLAY_{P2}$ inherent to the hexagonal gallium nitride-based semiconductor 17a is smaller than the original lattice constant $DSUB_P$ inherent to the hexagonal compound of the wafer 11a. This lattice constant is defined in the direction of the a-axis or the m-axis.

With reference to Part (b) of FIG. 3, the wafer 11b is provided, and has a primary surface of a nonpolar a-plane (or m-plane). The hexagonal gallium nitride-based semiconductor 17b is to be grown on the wafer 11b. The original lattice constant $DLAY_{N2}$ inherent to the hexagonal gallium nitride-based semiconductor 17b is smaller than the original lattice constant $DSUB_N$ inherent to the hexagonal compound of the wafer 11b. This lattice constant is defined in the direction of the c-axis.

With reference to Part (c) of FIG. 3, the wafer 11c is prepared which has a semipolar primary surface. The primary surface of the wafer 11c is composed of the hexagonal compound, and the primary surface tilts by an off-angle of 10 degrees or more and less than 80 degrees with reference to the c-plane of the hexagonal compound. The hexagonal gallium nitride-based semiconductor 17c is to be grown on the wafer 11c. In the wafer 11c having the tilting primary surface, the lattice constant as shown in Parts (a) and (b) of FIG. 3 cannot be represented in association with the primitive lattice in terms of the axial direction of the primitive lattice. However, the relationship between the size of the primitive lattice $DLAY_{H2}$ of the hexagonal gallium nitride-based semiconductor 17c and the size of the primitive lattice $DSUB_H$ of the hexagonal compound of the wafer 11c is the same as those shown in Parts (a) and (b) of FIG. 3.

Figure 4:
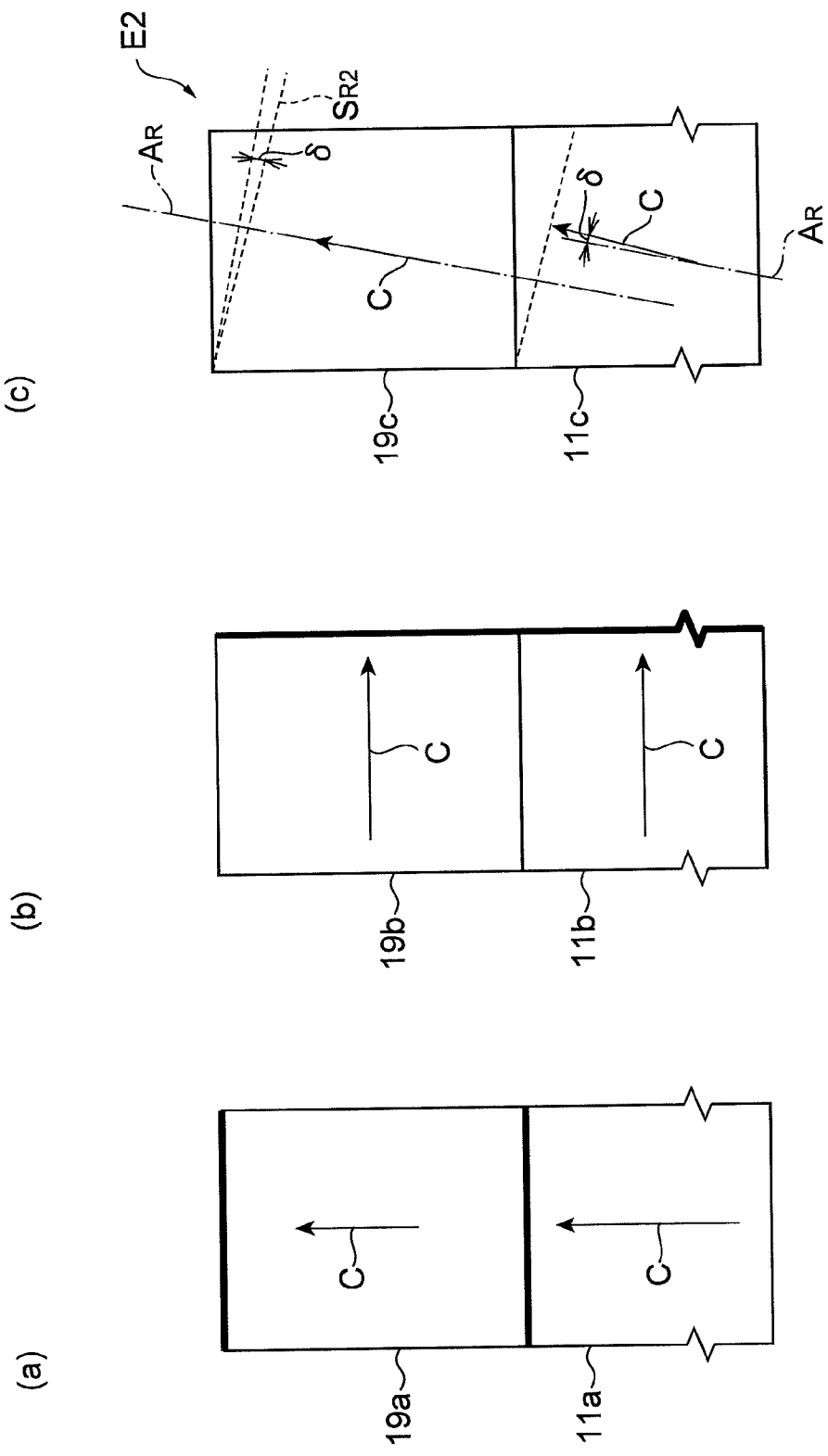
FIG. 4 is a view including schematic diagrams each of which illustrates a semiconductor layer of a hexagonal gallium nitride-based semiconductor grown on a supporting base of a hexagonal compound.

FIG. 4 includes schematic views illustrating a semiconductor layer of a hexagonal gallium nitride-based semiconductor grown on a supporting base of a hexagonal compound. In the material shown in FIG. 3, the lattice constant of the hexagonal compound is smaller than that of the hexagonal gallium nitride-based semiconductor. The vectors C shown in Parts (a), (b) and (c) of FIG. 4 indicate the direction of the c-axis of the hexagonal compound and hexagonal gallium nitride-based semiconductor. The hexagonal gallium nitride-based semiconductors are grown on the wafers 11a, 11b and 11c to form hexagonal gallium nitride-based semiconductors 19a, 19b and 19c, respectively. The original lattice constants inherent to the hexagonal gallium nitride-based semiconductors 17a, 17b and 17c vary depending on the lattice constants of the wafer 11a, 11b and 11c. Consequently, the hexagonal gallium nitride-based semiconductors 19a, 19b and 19c incorporate strains. If lattice defects, for example, dislocations are formed during a crystal growth, they cause the relaxation of strains therein to degrade the crystal quality. Accordingly, the occurrence of the strain relaxation is not desirable.

With reference to Part (c) of FIG. 4, the semipolar hexagonal gallium nitride-based semiconductor 19c also incorporates strains. In contrast to the hexagonal gallium nitride-based semiconductors 19a and 19b grown on the c-plane, the a-plane and the m-plane, in the hexagonal gallium nitride-based semiconductor 19c in which the strain remains without relaxation, the crystal plane such as the c-plane $SSUB_C$ of the wafer 11c extends parallel to the reference plane $S_{R2}$ that is not parallel to the corresponding crystal plane, for example, the c-plane $SLAY_{C1}$ of the hexagonal gallium nitride-based semiconductor 19c. This angular difference is demonstrated by the measurements of the X-ray diffractometry, as described below.

Where dislocations are formed during the growth of the hexagonal gallium nitride-based semiconductor onto the wafer 11c to relax strains therein, that is, a significantly large number of dislocations are formed, the hexagonal gallium nitride-based semiconductor is deformed as a result of the strain relaxation such that the crystal plane, for example, the c-plane $SLAY_{C1}$ of the hexagonal gallium nitride-based semiconductor extends parallel to the crystal plane, for example, the c-plane $SSUB_C$ of the wafer 11b. For example, when the hexagonal compound is GaN, the hexagonal gallium nitride-based semiconductor is composed of, for example, AlGaN or InAlGaN. The lattice constant of AlGaN depends on its aluminum composition, and is smaller than that of GaN.

Where the hexagonal gallium nitride-based semiconductor 19c also incorporates strain, that is, the occurrence of the dislocations and cracks in its growth becomes very low, the results of the X-ray diffractometry demonstrates that the tilt angle γ (absolute value) between the c-plane $SLAY_{C1}$ and the reference plane $S_{R2}$ in the hexagonal gallium nitride-based semiconductor 19c is 0.05 degree or more. In addition, the tilt angle γ (absolute value) is 2 degree or less. The above relationship on the tilt angle is satisfied over the entire primary surface of the wafer 11c.

The above explanation is made on a single semiconductor layer composed of the hexagonal gallium nitride-based semiconductor grown on the wafer 11c, as an example, with reference to FIGS. 3 and 4, and the incorporation of strain is also applicable to a structure that has a semiconductor stack including a plurality of semiconductor layers grown on the wafer 11c.

As can be seen from the above description, in the wafer 11c having the off-angle range described above, when a tilt angle between the (0001) plane of the wafer 11c and the (0001) plane of the hexagonal gallium nitride-based semiconductor 19c is in a range of 0.05 degree or more and 2 degrees or less, the strain relaxation is suppressed in the hexagonal gallium nitride-based semiconductor 19c to reduce the formation of dislocations in the hexagonal gallium nitride-based semiconductor 19c of the group III nitride semiconductor device. When the hexagonal gallium nitride-based semiconductor and the wafer 11c are composed of, for example, AlGaN and GaN, respectively, the tilt angle is defined by an angle between the (0001) plane of GaN of the wafer 11c and the (0001) plane of AlGaN of the semiconductor layer of the hexagonal gallium nitride-based semiconductor, and the occurrence of the strain relaxation is reduced in the AlGaN layer. In order to satisfy the relationship of the tilt angle, the aluminum composition is preferably 0.2 or less.

With reference to Part (c) of FIG. 4, the axis $A_R$ indicates the <0001> direction of the hexagonal gallium nitride-based semiconductor 19c. The <0001> direction of the wafer 11c is different from the axis $A_R$ in a transmission electron beam diffraction image. In order to clearly show the angular difference, an auxiliary axis $A_R$ is depicted in conjunction with the c-axis vector C of the wafer 11c. The angle δ between the auxiliary axis $A_R$ and the vector C relates to the incorporation of strain, and the angle δ is substantially equal to the angle γ. When these angles are 0.05 degree or more and 2 degrees or less, the relaxation of strain is suppressed in the hexagonal gallium nitride-based semiconductor 19c, to prevent the dislocation density in the hexagonal gallium nitride-based semiconductor 19c from increasing in the group III nitride semiconductor device. Since the hexagonal gallium nitride-based semiconductor 19c is elastically deformed in the plane parallel to the primary surface of the wafer 11c, the occurrence of relaxation of strain is suppressed and the <0001> direction of the wafer 11c is different from the <0001> direction of the hexagonal gallium nitride-based semiconductor 19c. The tilt angle relationship as above is satisfied over the entire primary surface of the wafer 11c.

The hexagonal gallium nitride-based semiconductor for the semiconductor stack may be composed of, for example, InAlGaN, in addition to InGaN or AlGaN. The tilt angle relationship as above holds over the entire primary surface of the wafer 11c.

When the semiconductor stack in each of the epitaxial wafers E1 and E2 includes an active layer composed of a hexagonal gallium nitride-based semiconductor, the group III nitride semiconductor device may be a semiconductor light-emitting device such as a light-emitting diode or a semiconductor laser. The peak wavelength of a photoluminescence spectrum of the active layer may be in the range of 400 nm or more to 550 nm or less. The group III nitride semiconductor light-emitting devices fabricated from these epitaxial wafers E1 and E2 have excellent emission properties because an increase in the dislocation density is suppressed due to elastic deformation of the semiconductor layers therein.

After other components, such as electrodes, are fabricated on the epitaxial wafers for group III nitride semiconductor light-emitting devices to form wafer products, these wafer products are separated into a number of semiconductor light-emitting devices. The semiconductor light-emitting device includes an active layer in a semiconductor stack on a supporting base formed by separation of the wafer 11c. In the semiconductor light-emitting device such as a light-emitting diode or a semiconductor laser, the active layer is provided so as to have electroluminescence with an emission peak in the wavelength range from 400 to 550 nm. The group III nitride semiconductor light-emitting device has satisfactory emission properties due to suppression of an increase in the dislocation density. In an embodiment, the active layer may have a quantum well structure including a well layer and a barrier layer. The active layer includes, for example, an InGaN well layer. The indium composition of the well layer preferably ranges from 0.07 to 0.35 for emission in the wavelength range from 400 to 550 nm. The thickness of the well layer preferably ranges from 1.5 to 10 nm.

The wafer 11c may be composed of, for example, sapphire or SiC. In the group III nitride semiconductor device, the supporting base composed of such a material can utilize the suppression of the relaxation of strain, as described above. For example, the supporting base may include an A-plane sapphire substrate and a GaN layer grown on the sapphire substrate. The A-plane sapphire substrate allows the epitaxial growth of GaN having a primary surface of the (10-12) plane. The epitaxial film of GaN having a dislocation density of $1 \times 10^{+8}$ cm$^{-2}$ or less can provide the advantage in a portion between an n-type GaN underlying layer and an InGaN layer of the present embodiment.

The wafer 11c may be composed of a gallium nitride-based semiconductor. The wafer 11c has a semipolar primary surface. In this group III nitride semiconductor device, since the wafer 11c and the semiconductor layers 15c and 19c are composed of gallium nitride-based semiconductors, the gallium nitride-based semiconductor having a high crystal quality can be grown on the gallium nitride-based semiconductor supporting base. The gallium nitride-based semiconductor supporting base preferably includes a gallium nitride-based semiconductor region having a threading dislocation density of $1 \times 10^7$ cm$^{-2}$ or less. The threading dislocation density may be defined, for example, in the c-plane of the gallium nitride-based semiconductor supporting base. The gallium nitride-based semiconductor can be grown on this gallium nitride-based semiconductor region with a low dislocation density. Thus, the occurrence of the strain relaxation is reduced because the density of dislocations coming from the wafer is low.

In the wafer 11c composed of GaN, the tilt angles $\alpha$ and $\gamma$ are defined by the (0001) plane of GaN of the supporting base 11c and the (0001) planes of the hexagonal gallium nitride-based semiconductors of the semiconductor layers 15c and 19c, respectively. The GaN wafer with high quality and a large diameter can reduce the occurrence of the relaxation of strain due to dislocations from the GaN wafer. In the GaN wafer having a semipolar primary surface, the off-angle varies over the entire primary surface. The requirements on the tilt angles $\alpha$ and $\gamma$ hold regardless of the above distribution of the off-angle.

Figure 5:
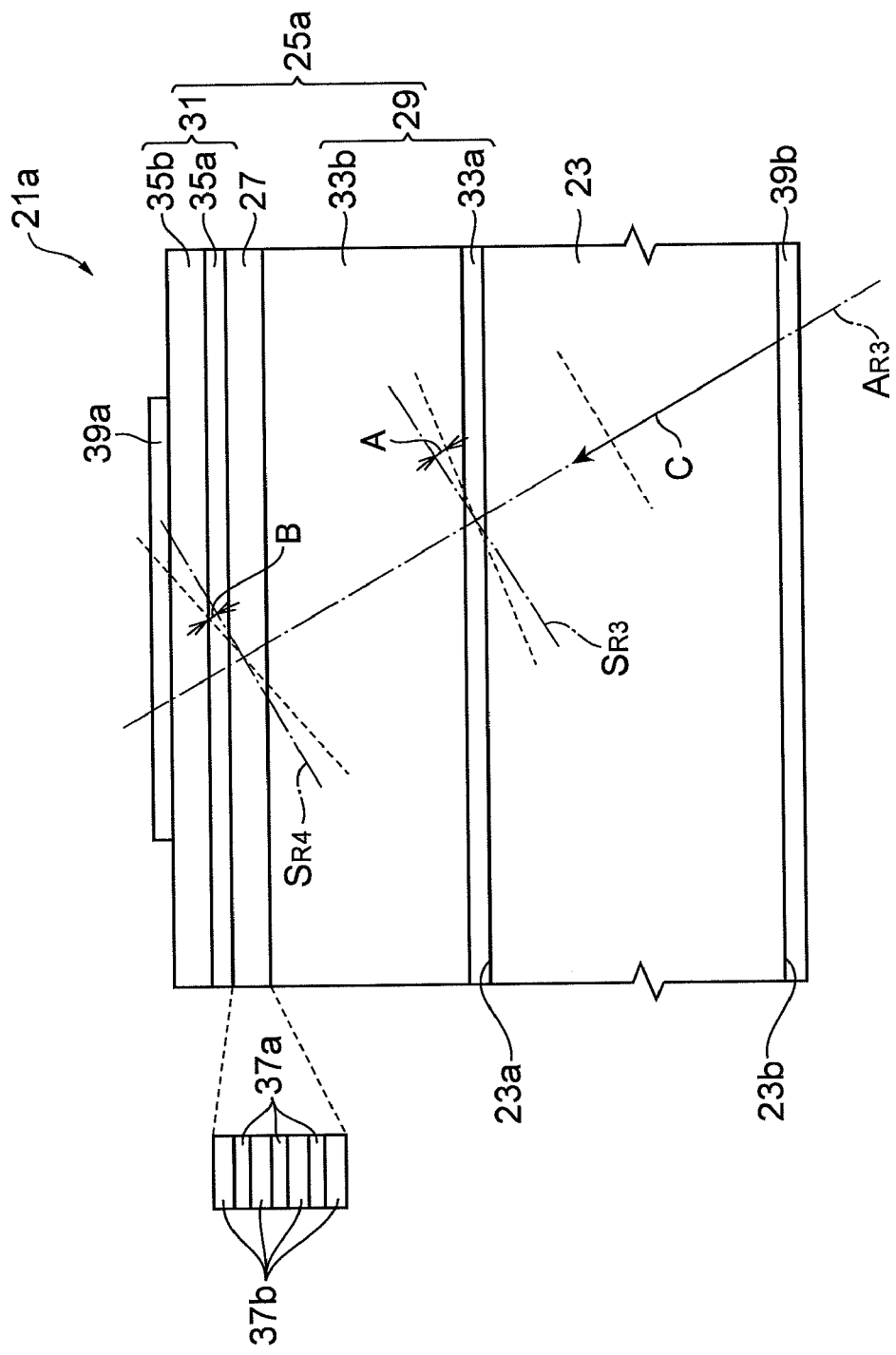
FIG. 5 is a schematic view illustrating a structure of a light-emitting diode according to an embodiment of the present invention.

FIG. 5 is a schematic view illustrating a structure of a light-emitting diode according to an embodiment of the present invention. The light-emitting diode 21a includes a supporting base 23 and a stack of semiconductor layers 25a provided on a primary surface 23a of the supporting base 23. The primary surface 23a of the supporting base 23 tilts by an off-angle of 10 degrees or more and less than 80 degrees with reference to the c-plane. The supporting base 23 may be composed of a single crystal. The semiconductor stack 25a includes an active layer 27 having an emission peak in a wavelength range from 400 to 550 nm. The active layer 27 is provided between an n-type gallium nitride-based semiconductor region 29 and a p-type gallium nitride-based semiconductor region 31. The n-type gallium nitride-based semiconductor region 29 includes a buffer layer 33a and an n-type GaN layer 33b. The p-type gallium nitride-based semiconductor region 31 includes an electron-blocking layer 35a and a contact layer 35b. The active layer 27 has a multiple quantum well structure including well layers 37a and barrier layers 37b that are alternately arranged. A first electrode 39a such as an anode is provided on the contact layer 35b, and a second electrode 39b such as a cathode is provided on the backside surface 23b of the supporting base 23.

An example of the structure of a light-emitting diode is as follows:
Supporting base 23: n-type GaN substrate;
Buffer layer 33a: Si-doped n-type $Al_{0.06}Ga_{0.94}N$ layer, 50 nm;
N-type GaN layer 33b: Si-doped n-type GaN layer, 2 μm;
Well layer 37a: three undoped $In_{0.18}Ga_{0.82}N$ layers, 5 nm;
Barrier layer 37b: undoped GaN layer, 13 nm;
Electron-blocking layer 35a: Mg-doped p-type $Al_{0.08}Ga_{0.92}N$ layer, 20 nm;
Contact layer 35b: Mg-doped p-type GaN layer, 50 nm.

In FIG. 5, the direction of the c-axis of the GaN supporting base is indicated by an axis $A_{R3}$. The tilt angle "A," which is formed between the (0001) plane (the reference plane $S_{R3}$ shown in FIG. 5) of the GaN supporting base and the (0001) plane of the AlGaN buffer layer 33a, is 0.05 degree or more and 2 degrees or less. The tilt angle B, which is formed between the (0001) plane of the GaN supporting base (the reference plane $S_{R4}$ shown in FIG. 5) and the (0001) plane of the well layer 37a, is 0.05 degree or more and 2 degrees or less. The tilt angles "A" and "B" are formed in a direction opposite to each other with reference to the c-plane of the GaN supporting base. The tilt angle relations hold over the entire primary surface of the supporting base 23.

Figure 6:
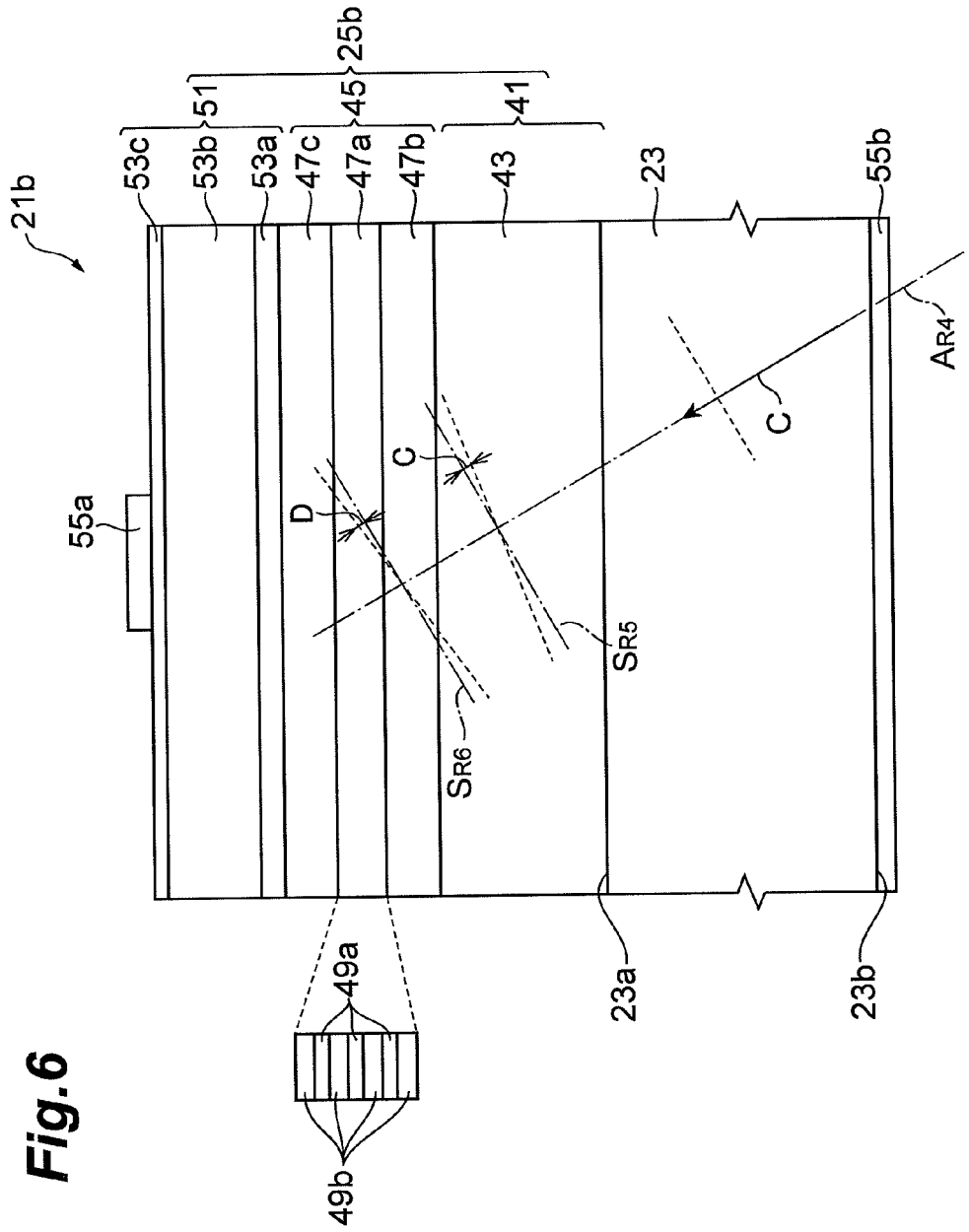
FIG. 6 is a schematic view illustrating a structure of a semiconductor laser according to an embodiment of the present invention.

FIG. 6 is a schematic view illustrating a structure of a semiconductor laser according to an embodiment of the present invention. The semiconductor laser 21b includes a supporting base 23 and a stack of semiconductor layers 25b provided on a primary surface 23a of the supporting base 23. The supporting base 23 may have a single crystal region onto which the light emitting region of the active layer is aligned. The semiconductor stack 25b includes an n-type gallium nitride-based semiconductor region 41, an optical waveguide region 45, and a p-type gallium nitride-based semiconductor region 51. The optical waveguide region 45 is provided between the n-type gallium nitride-based semiconductor region 41 and the p-type gallium nitride-based semiconductor region 51. The optical waveguide region 45 includes an active layer 47a, and the active layer 47a is provided between optical guiding layers 47b and 47c. The active layer 47a has a lasing wavelength within the range of 400 to 550 nm. The active layer 47a has a multiple quantum well structure including well layers 49a and barrier layers 49b that are alternately arranged. The n-type gallium nitride-based semiconductor region 41 includes an n-type cladding layer 43. The p-type gallium nitride-based semiconductor region 51 includes an electron-blocking layer 53a, a p-type cladding layer 53b and a p-type contact layer 53c. A first electrode 55a such as an anode is provided on the contact layer 53c, and a second electrode 55b such as a cathode is provided on the backside surface 23b of the supporting base 23.

An example of the structure of a laser diode (LD) is as follows:

Supporting base 23: n-type GaN substrate;
N-type cladding layer 43: Si-doped n-type $Al_{0.03}Ga_{0.97}N$ layer, 2 μm;
N-side light-guiding layer 47b: undoped $In_{0.02}Ga_{0.98}N$ layer, 100 nm;
Well layer 49a: three undoped $In_{0.08}Ga_{0.92}N$ layers, 5 nm;
Barrier layer 49b: undoped GaN layer, 15 nm;
P-side light-guiding layer 47c: undoped $In_{0.02}Ga_{0.98}N$ layer, 100 nm;
Electron-blocking layer 53a: Mg-doped p-type $Al_{0.18}Ga_{0.82}N$ layer, 20 m;
P-type cladding layer 53b: Mg-doped p-type $Al_{0.06}Ga_{0.94}N$ layer, 400 nm;
Contact layer 53c: Mg-doped p-type GaN, 50 nm.

FIG. 6 shows an axis $A_{R4}$ indicating the direction of the c-axis of the GaN supporting base. The tilt angle "C" formed between the (0001) plane of the GaN supporting base and the (0001) plane of the n-type cladding layer 43a (the reference plane $S_{R5}$ shown in FIG. 6) is 0.05 degree or more and 2 degrees or less. The tilt angle "D" formed between the (0001) plane (the reference plane $S_{R6}$ shown in FIG. 6) of the GaN supporting base and the (0001) planes of the light-guiding layers 49a and 49b is 0.05 degree or more and 2 degrees or less. The tilt angles "A" and "B" are formed in a direction opposite to each other with reference to the c-plane of the GaN supporting base. The tilt angle relation holds over the entire primary surface of the supporting base 23.

EXAMPLES

Figure 7:
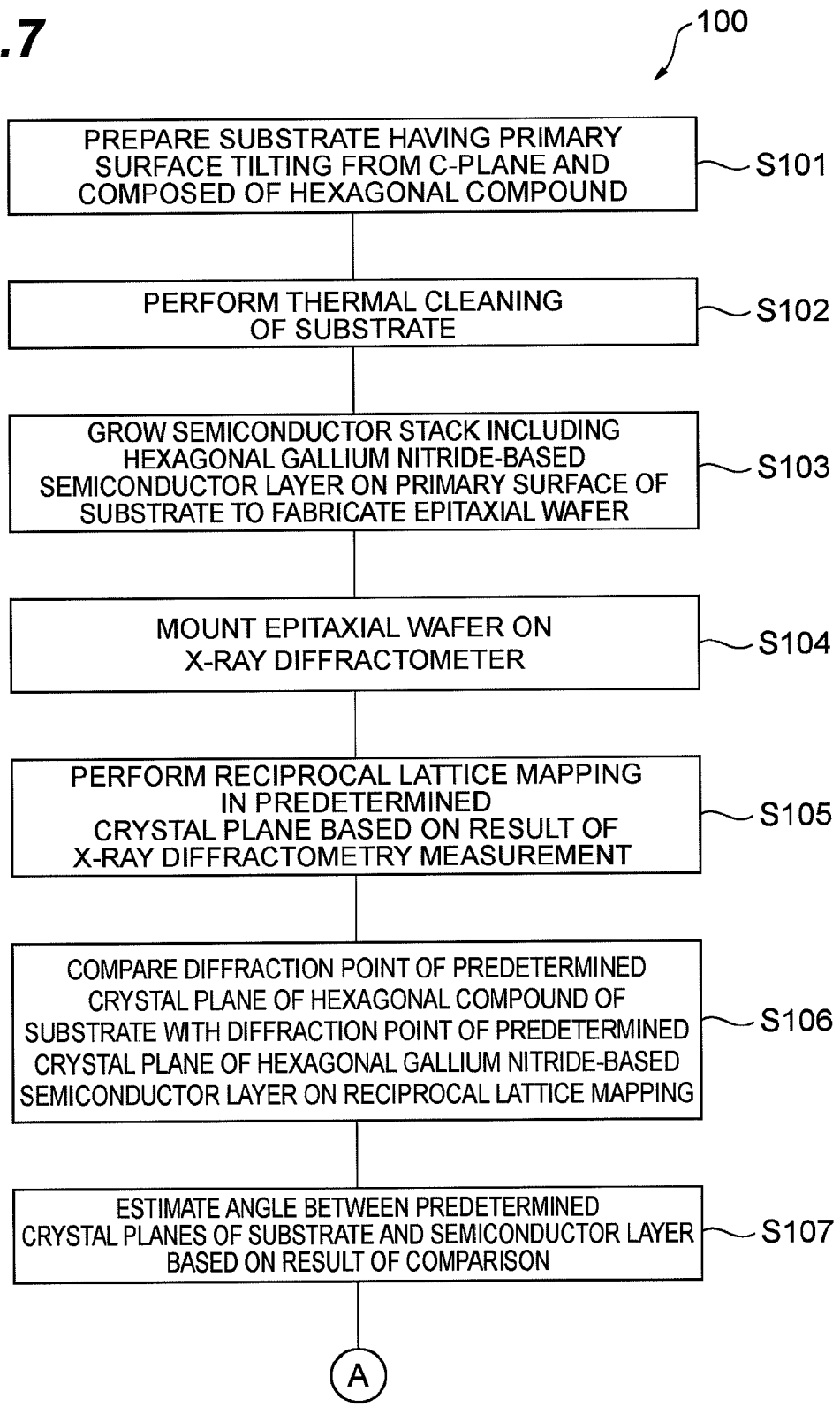
FIG. 7 is a flowchart of primary steps in a method of fabricating process a light-emitting diode.
Figure 8:
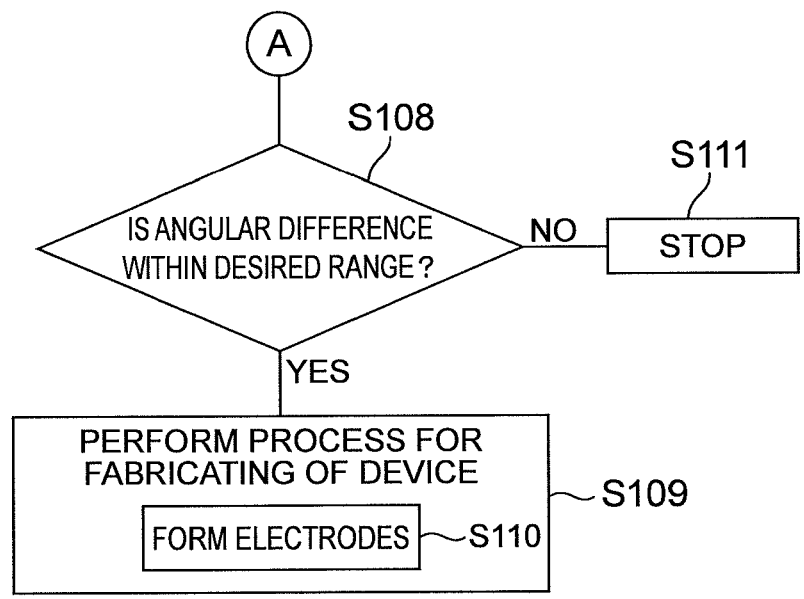
FIG. 8 is a flowchart of primary steps in the method of fabricating the light-emitting diode.

Light-emitting diodes were fabricated by organometallic vapor phase epitaxy. FIGS. 7 and 8 are flowcharts of primary steps in a process of fabricating the light-emitting diodes. The following materials were used: trimethylgallium (TMG); trimethylaluminum (TMA); trimethylindium (TMI); ammonia ($NH_3$); silane ($SiH_4$); and bis(cyclopentadienyl)magnesium ($CP_2Mg$).

As shown in step S101 in a process flow 100, the following GaN wafers were prepared:
GaN wafer, Off-angle in m-axis direction, Off-angle in a-axis direction.

| | | |
|---|---|---|
| m16: | 16.4 degrees, | 0.2 degree; |
| m26: | 26.4 degrees, | 0.1 degree. |

The off-angles were determined by use of X-ray diffractometry.

The GaN wafers m16 and m26 were loaded onto a susceptor in the reactor. Semiconductor growth was carried out by the following steps: In step S102, the wafers were heat-treated at a substrate temperature of 1050° C. under a reactor pressure of 101 kPa, while supplying $NH_3$ and $H_2$ to the reactor. The heat treatment is used for cleaning, and the period of time for the heat treatment was 10 minutes. Next, in step S103, $NH_3$, TMA, TMG and $SiH_4$ were supplied to the reactor to grow an AlGaN buffer layer having a thickness of 50 nm. Then, the supply of TMA was stopped, but $NH_3$, TMG, and $SiH_4$ were supplied to the reactor without interruption to grow a Si-doped GaN layer having a thickness of 2000 nm. After Si-doped GaN layer has been grown, the supply of $NH_3$, TMG and $SiH_4$ were stopped. The substrate temperature was lowered to around 700° C. $NH_3$, TMG, TMI, and $SiH_4$ were supplied to the reactor at this temperature to grow a Si-doped InGaN buffer layer having a thickness of 50 nm. The growth of a light emitting layer was carried out as follows. The light emitting layer has a three-period multiple quantum well structure including GaN barrier layers each having a thickness of 15 nm, and InGaN well layers each having a thickness of 5 nm. After the quantum well structure was grown, the supply of TMG and TMI were stopped, and the substrate temperature was raised to 1000° C. TMG, TMA, $NH_3$, and $CP_2Mg$ were supplied to the reactor to grow a Mg-doped p-type AlGaN having a thickness of 20 nm at this temperature. After the Mg-doped p-type AlGaN was grown, the supply of TMA was stopped, and TMG, $NH_3$, and $CP_2Mg$ were supplied to the reactor to grow a p-type GaN layer having a thickness of 50 nm. After the substrate temperature was lowered to room temperature, the epitaxial wafers were unloaded from the reactor. The structures of the epitaxial wafers E16 and E26 are formed from the GaN wafers m16 and m26, respectively, and these the GaN wafers m16 and m26 are the same as the epitaxial structure of the LED shown in FIG. 5.

Figure 9:
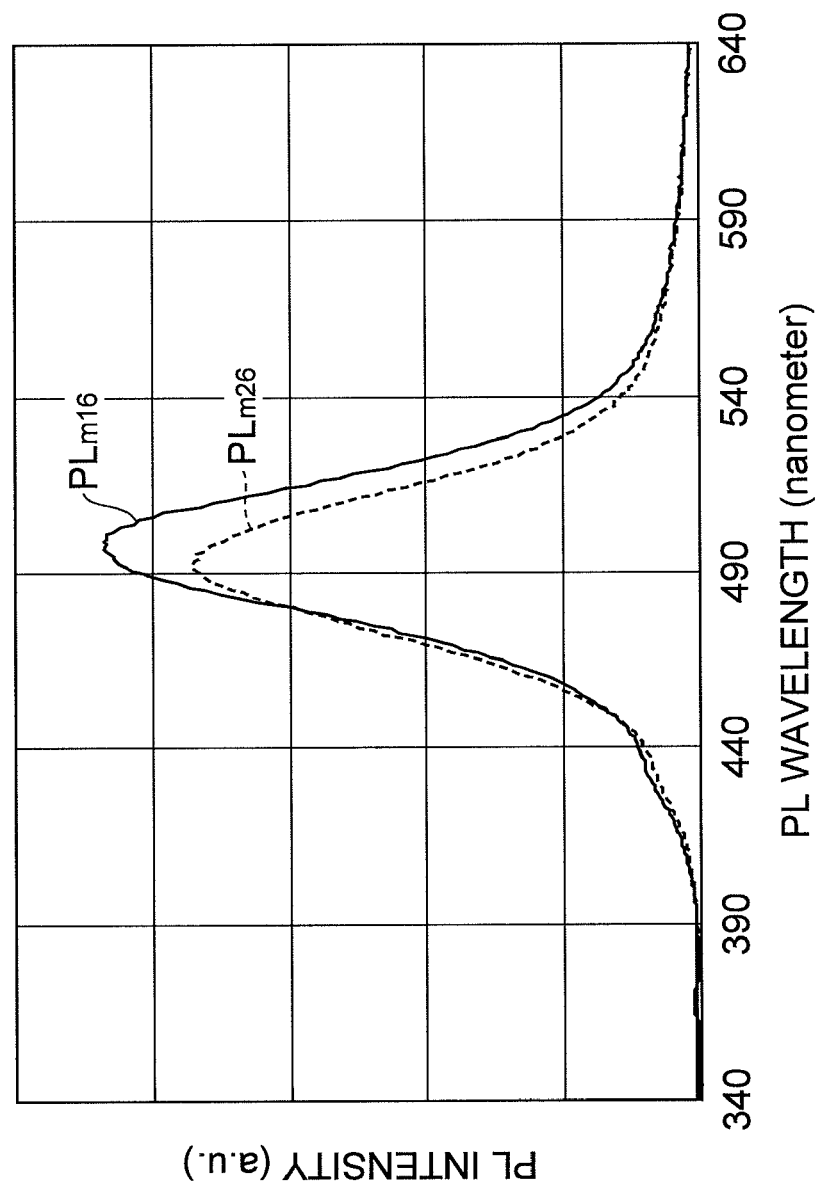
FIG. 9 is a graph showing typical PL spectra.

The photoluminescence (PL) spectra of the epitaxial wafers E16 and E26 were evaluated at room temperature. A He—Cd laser of 325 nanometers was used as excitation light source. The laser power at a sample was 1 mW and the spot diameter was about 200 μm. FIG. 9 shows typical photoluminescence spectra $PL_{m16}$ and $PL_{m26}$. The emission peak wavelength of the epitaxial wafer E16 was 500 nm, and the emission peak wavelength of the epitaxial wafer E26 was 495 nm.

In step S104, the epitaxial wafer E16 was evaluated by x-ray diffractometry. The slit size for the incident X-ray beam was 0.2 mm long and 2 mm wide. After the off-direction was aligned to the direction of the incident x-ray beam, the height of the stage was adjusted, alignment of the axis was carried out with reference to (20-25) plane, and the offset angle of the (0002) plane was set to zero.

Figure 10:
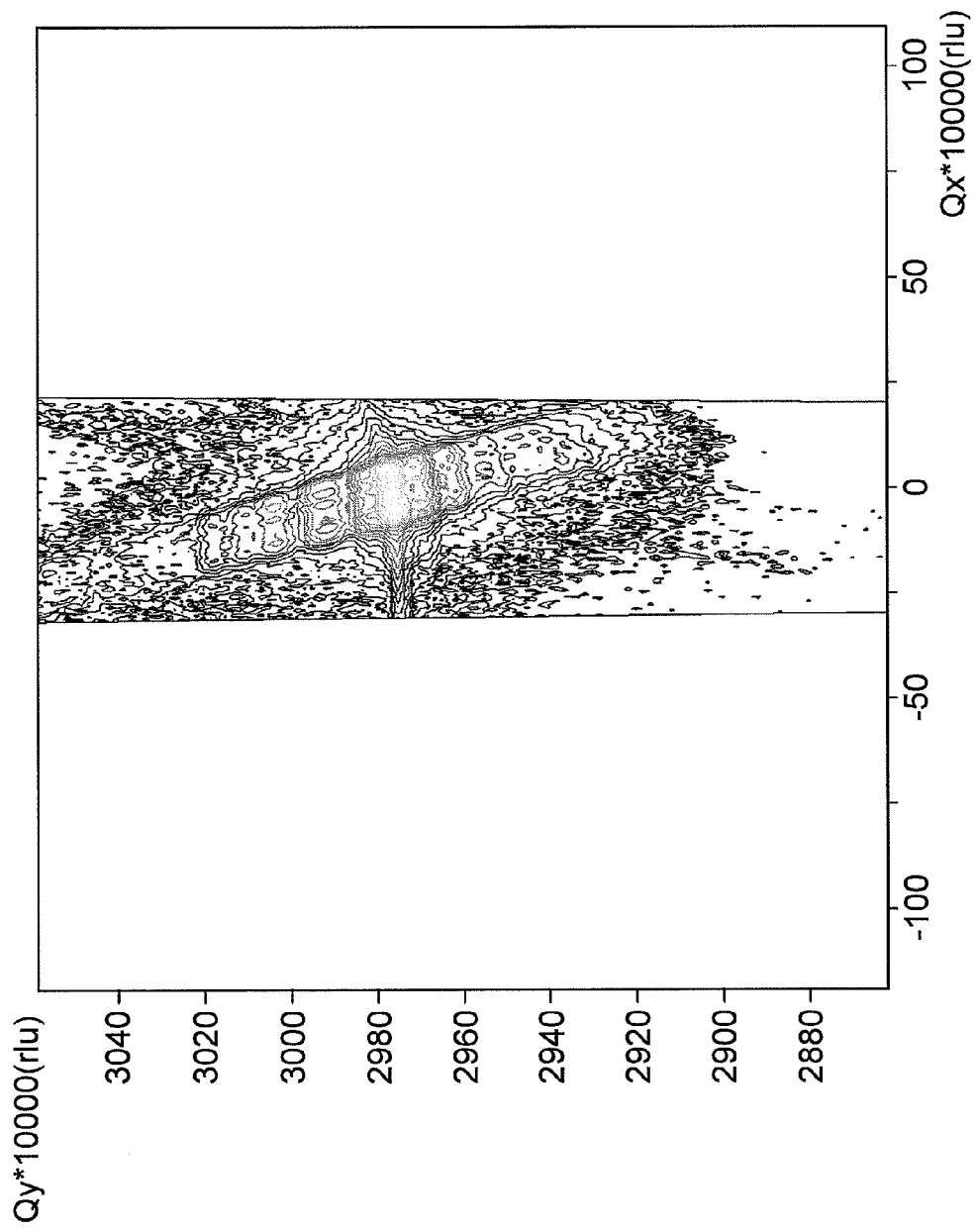
FIG. 10 is a graph showing an observed reciprocal lattice mapping image.

In step S105, the reciprocal lattice map of the (0002) plane was prepared. FIG. 10 shows the observed reciprocal lattice map of the m16. The vertical axis indicates the inverse of the lattice constant of the c-axis multiplied by a coefficient, and the horizontal axis indicates the inverse of the lattice constant of the a-axis multiplied by a coefficient. The reciprocal lattice map included diffraction from the GaN substrate, diffraction from the InGaN layer, and diffraction from the AlGaN layer.

In step S106, the image of the reciprocal lattice map was investigated. The image of the reciprocal lattice map showed that the diffractions from the InGaN layer and the AlGaN layer were not present on the ω-2θ plane with reference to the GaN substrate peak. This reveals that the <0001> direction of GaN is different from the <0001> direction of InGaN and that the <0001> direction of GaN is also different from the <0001> direction of AlGaN. In step S107, the (0001) plane of the InGaN layer and the (0001) plane of the GaN layer form an angle of about 0.45 degree, resulting in that these (0001) planes are not parallel to each other. In addition, the (0001) plane of the AlGaN layer and the (0001) plane of the GaN layer form an angle of about 0.1 degree, resulting in that these (0001) planes are not parallel to each other.

Next, the epitaxial wafer E26 was evaluated with a transmission electron microscope. A focused ion beam (FIB) method was used to form samples, and their damages were removed by ion milling. The incident direction of the electron beam was set in the <11-20> direction (the a-axis direction) orthogonal to the off-direction angle. The acceleration voltage of the electron beam was 200 kV. FIG. 11 is a magnified image of an active layer and its vicinity in the LED structure of the m26 shown in FIG. 5. The transmission electron microscopic image reveals that the three-period quantum well structure has a well width of about 5 nm. The dislocations were not observed therein, and the high-quality active layer was formed.

Figure 12:
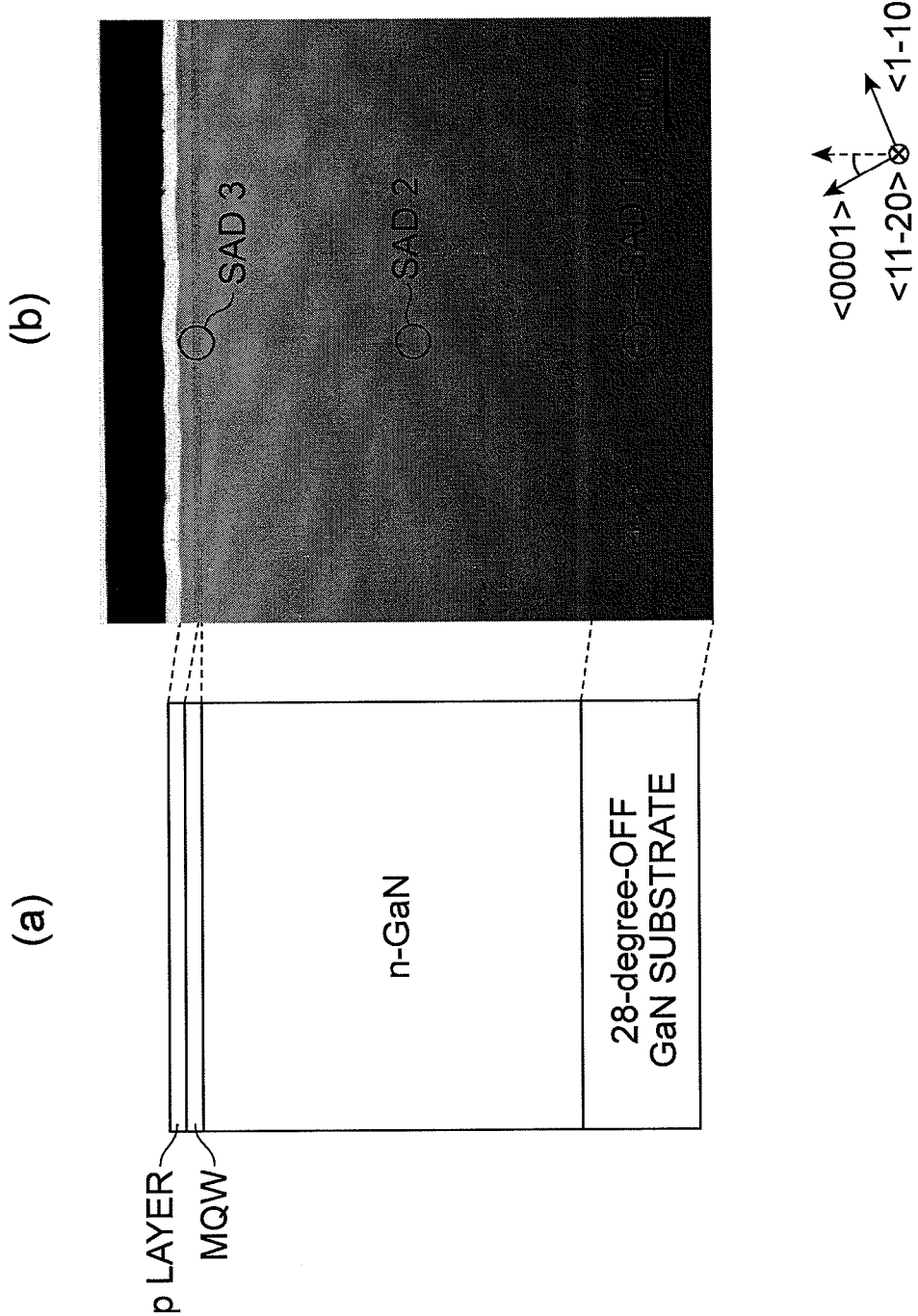
FIG. 12 is a schematic view illustrating a structure of an epitaxial wafer E26 and an image, associated with the structure, on which measuring points is depicted.
Figure 13:
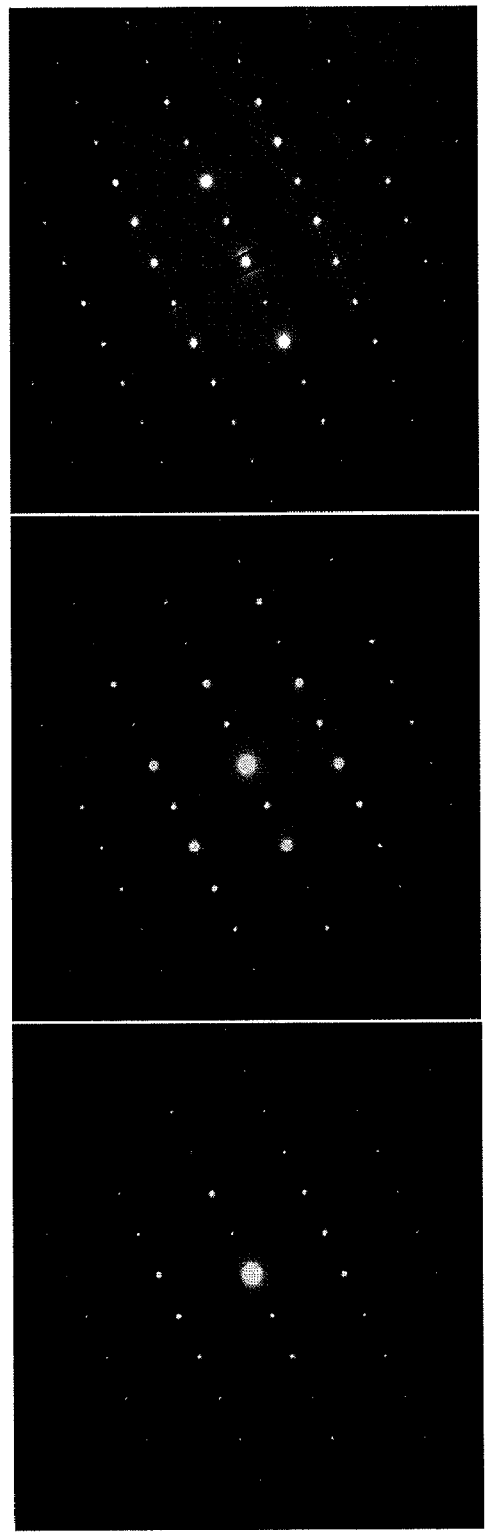
FIG. 13 is a view including images that show diffraction patterns observed at the three measuring points.

The selected-area electron diffractometry was performed to obtain information on lattice planes. The diameter of the selected-area aperture was 0.1 μm. FIG. 12 shows a schematic view illustrating a structure of the epitaxial wafer E26 and measuring points associated with the structure. FIG. 13 shows images of diffraction patterns observed at the three measuring points. With reference to Part (a) of FIG. 13, the <0001> direction of the substrate tilts by about 26 degrees from the vertical direction to the left, as designed. With reference to Part (b) of FIG. 13, the n-GaN layer also shows a similar pattern. The patterns in Parts (a) and (b) of FIG. 13 reveal that the GaN layers are epitaxially grown on the respective GaN wafers. As shown in Part (c) of FIG. 13, the observation of a region including an active layer through selected-area electron diffractometry was performed in the same manner. FIG. 14 shows electron diffraction images at the measuring points SAD2 and SAD3. FIG. 15 shows magnified views of the electron diffraction images measured at the points SAD2 and SAD3 shown in Parts (a) and (b) of FIG. 14. With reference to Parts (a) and (b) of FIG. 15, tails extending in a direction perpendicular to the substrate surface appear at the reciprocal lattice points in the magnified image of Part (b) of FIG. 15 which shows the observed area for the active layer. These tails are assigned to diffractions from InGaN and AlGaN. The occurrence of the tails shows that the <0001> direction of InGaN is not consistent with the <0001> direction of GaN. Thus, it is clearly seen that the (0001) plane of the InGaN layer is not parallel to the (0001) plane of the GaN layer.

Through the measurements obtained by the X-ray diffractometry and/or the transmission electron microscopy, an amount of strain in gallium nitride-based semiconductor crystal was estimated by comparisons between directions of a predetermined crystal plane and a predetermined crystal axis of GaN and directions of a predetermined crystal plane and a predetermined crystal axis of a gallium nitride-based semiconductor (for example, InGaN, AlGaN, or AlInGaN) other than GaN in an epitaxial wafer. In step S108, it was determined whether the relaxation of strain falls within a desired amount range or not. If the relaxation of strain falls in a desired level or less, the epitaxial wafer passes the test to be qualified as good items. Then, the next process of the passed epitaxial wafer was performed in step S109 for fabricating the device. For example, in step S110, electrodes for the semiconductor device were formed thereon. In step S111, if the relaxation of strain exceeds the desired level, the process for the epitaxial wafer was not carried out any more.

The above example and other experiments show that, when a tilt angle between the (0001) plane of the hexagonal compound of the supporting base and the (0001) plane of the hexagonal gallium nitride-based semiconductor of the semiconductor layer is 2 degrees or less, the relaxation of strain is suppressed to provide a light-emitting device with excellent properties. A tilt angle of 0.05 degree or more can ensure the verification through X-ray diffractometry.

Part (a) of FIG. 16 shows a calculated tilt angle for InGaN. The arrow "Angle" indicates the range of the off-angle. The symbol "□" indicates the tilt angle in the m-axis at an indium composition of 0.35, the symbol "♦" indicates the tilt angle in the a-axis at an indium composition of 0.35, and the symbol "Δ" indicates the tilt angle in the a-axis at an indium composition of 0.07. In a stack of epitaxial layers that generates light having a peak wavelength within the range of 400 to 550 nm, the indium composition is preferably in the range of, for example, about 0.07 to about 0.35. The lower limit of the tilt angle can be about 0.05 degree, for example, at an indium composition of 0.07 and off-angle of 10 degrees in the a-axis. Such a value is estimated as a minimum value that can be verified by X-ray diffractometry at present. The upper limit of the tilt angle is about 1.6 degrees, for example, at an indium composition of 0.35 and an off-angle of 43 degrees in the m-axis.

Part (b) of FIG. 16 shows a calculated value of a tilt angle of AlGaN. The arrow "Angle" indicates the range of the off-angle. The symbol "□" indicates the tilt angle in the m-axis at an aluminum composition of 0.2, the symbol "♦" indicates the tilt angle in the a-axis at an aluminum composition of 0.2, and the symbol "Δ" indicates the tilt angle in the a-axis at an aluminum composition of 0.02. In a stack of epitaxial layers that generates light having a peak wavelength within the range of 400 to 550 nm, the aluminum composition is preferably in the range of, for example, about 0.02 to about 0.2. When the tilt angle for AlGaN is calculated in the same manner as in the case of InGaN, the lower limit of the tilt angle is about 0.005 degree, for example, at an aluminum composition of 0.02 and an off-angle in the a-axis of 10 degrees. Such a value is lower than the detection limit of the X-ray diffractometry. The upper limit of the tilt angle is about 0.3 degree, for example, at an aluminum composition of 0.2 and an off-angle in the m-axis of 43 degrees.

The tilt angle can be calculated, for example, by the following process: (1) choose an In composition of the InGaN epitaxial film or an Al composition of the AlGaN epitaxial film; (2) Calculate the lattice constant of the c-axis of a strained InGaN or AlGaN; (3) Calculate the respective angles of the (hikl) planes of the hexagonal crystal wafer and the epitaxial film with reference to the (0001) plane. (4) Calculate the angular difference between the (hikl) plane of the epitaxial film and the (hikl) plane of the hexagonal crystal wafer. The above sequence provides a value of the tilt angle. In order to avoid complicated calculation, approximate calculation is performed by assuming that the tilt angle Δθ (the (0001) plane of the epitaxial film–the (0001) plane of the wafer) is the same as the tilt angle (the (hkil) plane of the epitaxial film–the (hkil) plane of the wafer) on the crystal plane of a plane index of an epitaxial film grown on the c-plane. Based on this procedure, the similar calculation can be performed for InAlGaN.

A light-emitting device in which the relaxation of strain is caused exhibits poor device characteristics, such as at least 20% decrease in luminous efficiency, an increased leakage current in low current operation, and a reduced lifetime. Accordingly, it is important to prevent the relaxation of strain in devices formed on semipolar planes.

With respect to the lifetime of the device in continuous current operation, it is noted that a sliding plane to create dislocations in the hexagonal GaN is the (0001) plane. Since the sliding plane and the growing plane are parallel in the device formed on the c-plane, it is practically impossible that the creation of dislocations occurs during the device operation. In contrast, since the growth plane intersects with the (0001) plane in a device formed on a semipolar plane, the creation of dislocations may easily occur during the device operation when compared to the device on the c-plane. Accordingly, it is important to prevent the relaxation of strain in the epitaxial growth layer.

In general, the research and development of devices using a c-plane substrate are ahead in nitride light-emitting devices. In comparison with the case of c-plane, significant changes in growth conditions of epitaxial films are required in the fabrication of devices using semipolar planes. In the growth, in particular, the indium composition decreases in InGaN, whereas the aluminum composition decreases in AlGaN. In order to compensate for these decreases, when compared with the growth conditions on the c-plane, in the growth of InGaN, the optimum growth temperature range becomes lower than the temperature of the crystal growth on the c-plane by about 50 to 150 degrees (Celsius temperature unit). In the growth of AlGaN, as compared with the growth condition for the c-plane, the optimum growth temperature range becomes higher than the temperature of the crystal growth on the c-plane by about 10 to 50 degrees (Celsius temperature unit). The temperature sequence for growing a structure for a light-emitting device greatly differs between the c-plane and the semipolar plane.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

INDUSTRIAL APPLICABILITY

As described above, one aspect of the present invention provides a group III nitride semiconductor device that can suppress the occurrence of dislocations caused by the relaxation of strain in a gallium nitride-based semiconductor utilizing semipolar. Another aspect of the present invention provides an epitaxial wafer for the group III nitride semiconductor device.

REFERENCE SIGNS LIST

| | |
|---|---|
| C: | c-axis direction of hexagonal compound; |
| $SSUB_C$: | c-plane of hexagonal compound; |
| $SLAY_C$: | c-plane of hexagonal gallium nitride-based semiconductor; |
| $DSUB_N$: | lattice constant of hexagonal compound of polar plane wafer; |
| $DLAY_{N1}$: | lattice constant of hexagonal gallium nitride-based semiconductor; |
| $DSUB_P$: | lattice constant of hexagonal compound of nonpolar plane wafer; |
| $DLAY_{P1}$ and $DLAY_{P2}$: | lattice constant of hexagonal gallium nitride-based semiconductor; |
| $DSUB_H$: | lattice constant of hexagonal compound of semipolar plane wafer; |
| $DLAY_{H1}$, $DLAY_{H2}$: | lattice constant of hexagonal gallium nitride-based semiconductor; |
| $SSUB_C$: | c-plane of wafer; |
| $SLAY_{C1}$, $SLAY_{C2}$: | c-plane of hexagonal gallium nitride-based semiconductor; |
| $S_{R1}$, $S_{R2}$: | reference plane; |
| α: | tilt angle between c-plane $SLAY_{C1}$ and reference plane $S_{R1}$; |
| $A_R$: | auxiliary line; |
| β: | angle between axis $A_R$ and vector C; |
| γ: | tilt angle between c-plane $SLAY_{C1}$ and reference plane $S_{R2}$; |
| δ: | angle between auxiliary line $A_R$ and vector C; |
| 11a, 11b, 11c: | wafer composed of hexagonal compound; |
| 13a, 13b, and 13c: | semiconductor layer composed of hexagonal gallium nitride-based semiconductor; |
| 15a, 15b, and 15c: | hexagonal gallium nitride-based semiconductor; |
| 17a, 17b, and 17c: | semiconductor layer composed of hexagonal gallium nitride-based semiconductor; |
| 19a, 19b, and 19c: | hexagonal gallium nitride-based semiconductor; |
| 21a: | light-emitting diode; |
| 21b: | semiconductor laser; |
| 23: | supporting base; |
| 25a, 25b: | semiconductor stack; |
| 27: | active layer; |
| 29: | n-type gallium nitride-based semiconductor region; |
| 31: | p-type gallium nitride-based semiconductor region; |
| 33a: | buffer layer; |
| 33b: | n-type GaN layer; |
| 35a: | electron-blocking layer; |
| 35b: | contact layer; |
| 37a: | well layer; |
| 37b: | barrier layer; |
| 41: | n-type gallium nitride-based semiconductor region; |
| 43: | n-type cladding layer; |
| 45: | optical waveguide region; |
| 47a: | active layer; |
| 47b: | n-side optical guiding layer; |
| 47c: | p-side optical guiding layer; |
| 49a: | well layer; |
| 49b: | barrier layer; |
| 51: | p-type gallium nitride-based semiconductor region; |
| 53a: | electron-blocking layer; |
| 53b: | p-type cladding layer; |
| 53c: | contact layer. |

The invention claimed is:

1. A group III nitride semiconductor device, comprising:
   a supporting base having a semipolar primary surface, the semipolar primary surface comprising a hexagonal compound; and
   a semiconductor region provided on the semipolar primary surface of the supporting base, the semiconductor region comprising a semiconductor layer, the semiconductor layer comprising a hexagonal gallium nitride-based semiconductor different from the hexagonal compound,
   a tilt angle between a (0001) plane of the hexagonal compound of the supporting base and a (0001) plane of the hexagonal gallium nitride-based semiconductor of the semiconductor layer being in a range of +0.05 degree to +2 degrees and −2 degrees to −0.05 degrees, and
   the hexagonal gallium nitride-based semiconductor of the semiconductor layer comprising AlInGaN.

2. The group III nitride semiconductor device according to claim 1, wherein
   the semiconductor region comprises an active layer comprising a hexagonal gallium nitride-based semiconductor,
   the active layer is provided so as to emit light having an emission peak in a wavelength range from 400 nm to 550 nm,
   the active layer comprises an InGaN well layer, and
   the group III nitride semiconductor device includes one of a light-emitting diode and a semiconductor laser.

3. The group III nitride semiconductor device according to claim 1, wherein the supporting base comprises one of sapphire, SiC and GaN.

4. The group III nitride semiconductor device according to claim 1, wherein
   the supporting base comprises a gallium nitride-based semiconductor.

5. The group III nitride semiconductor device according to claim 1, wherein the supporting base has a gallium nitride-based semiconductor region having a threading dislocation density of $1 \times 10^7$ cm$^{-2}$ or less.

6. The group III nitride semiconductor device according to claim 1, wherein
   the hexagonal compound of the supporting base is GaN, and
   the tilt angle is defined by an angle between a (0001) plane of GaN of the supporting base and the (0001) plane of the hexagonal gallium nitride-based semiconductor.

7. The group III nitride semiconductor device according to claim 6, wherein
   the hexagonal gallium nitride-based semiconductor of the semiconductor layer comprises InGaN, and the tilt angle is defined by an angle between the (0001) plane of GaN of the supporting base and a (0001) plane of InGaN of the semiconductor layer.

8. The group III nitride semiconductor device according to claim 6, wherein the hexagonal gallium nitride-based semiconductor of the semiconductor layer comprises AlGaN, and the tilt angle is formed by an angle between the (0001) plane of GaN of the supporting base and a (0001) plane of AlGaN of the semiconductor layer.

9. The group III nitride semiconductor device according to claim 1, wherein a first axis indicating the <0001> direction of the hexagonal compound extends in a direction different from that of a second axis indicating the <0001> direction of the hexagonal gallium nitride-based semiconductor in a transmission electron microscopic image.

10. The group III nitride semiconductor device according to claim 1, wherein the hexagonal gallium nitride-based semiconductor is elastically distorted in a reference plane parallel to the semipolar primary surface of the supporting base.

11. The group III nitride semiconductor device according to claim 1, wherein the supporting base comprises an A-plane sapphire substrate and a GaN layer provided on the sapphire substrate.

12. The group III nitride semiconductor device according to claim 1, wherein a first axis indicating the <0001> direction of the supporting base extends in a direction different from that of a second axis indicating the <0001> direction of the hexagonal gallium nitride-based semiconductor in a transmission electron microscopic image.

13. An epitaxial wafer, comprising:

a wafer having a semipolar primary surface, the semipolar primary surface comprising a hexagonal compound; and a semiconductor region provided on the semipolar primary surface of the wafer, the semiconductor region comprising a semiconductor layer, the semiconductor layer comprising a hexagonal gallium nitride-based semiconductor different from the hexagonal compound, a tilt angle between a (0001) plane of the hexagonal compound of the wafer and a (0001) plane of the hexagonal gallium nitride-based semiconductor of the semiconductor layer being in a range of +0.05 degree to +2 degrees and −2 degrees to −0.05 degrees, and the hexagonal gallium nitride-based semiconductor of the semiconductor layer comprising AlInGaN.

14. The epitaxial wafer according to claim 13, wherein the semiconductor region comprises an active layer comprising a hexagonal gallium nitride-based semiconductor, and the active layer has a peak wavelength between 400 nm and 550 nm in a photoluminescence spectrum of the active layer.

15. The epitaxial wafer according to claim 13, wherein the wafer comprises one of sapphire, SiC and GaN.

16. The epitaxial wafer according to claim 13, wherein the wafer comprises the gallium nitride-based semiconductor.

17. The epitaxial wafer according to claim 13, wherein the wafer has a gallium nitride-based semiconductor region having a threading dislocation density of $1\times10^7$ cm$^{-2}$ or less.

18. The epitaxial wafer according to claim 13, wherein a maximum of a distance between two points on edges of the wafer is 45 mm or more, the hexagonal compound of the wafer is GaN, and the tilt angle is formed by a (0001) plane of GaN of the wafer and the (0001) plane of the hexagonal gallium nitride-based semiconductor of the semiconductor layer.

19. The epitaxial wafer according to claim 18, wherein the hexagonal gallium nitride-based semiconductor of the semiconductor layer comprises InGaN, and the tilt angle is formed by the (0001) plane of GaN of the wafer and a (0001) plane of InGaN of the semiconductor layer.

20. The epitaxial wafer according to claim 18, wherein the hexagonal gallium nitride-based semiconductor of the semiconductor layer comprises AlGaN, and the tilt angle is formed by the (0001) plane of GaN of the wafer and a (0001) plane of AlGaN of the semiconductor layer.

21. The epitaxial wafer according to claim 13, wherein the <0001> direction of GaN of the wafer is different from the <0001> direction of the hexagonal gallium nitride-based semiconductor in a transmission electron microscopic image.

22. The epitaxial wafer according to claim 13, wherein the hexagonal gallium nitride-based semiconductor is elastically deformed in a reference plane parallel to the semipolar primary surface of the wafer.

23. The epitaxial wafer according to claim 13, wherein a first axis indicating the <0001> direction of the wafer extends in a direction different from that of a second axis indicating the <0001> direction of the hexagonal gallium nitride-based semiconductor in a transmission electron microscopic image of the epitaxial wafer.

* * * * *